(12) United States Patent
Watanabe et al.

(10) Patent No.: US 7,884,416 B2
(45) Date of Patent: Feb. 8, 2011

(54) SEMICONDUCTOR INTEGRATED CIRCUIT

(75) Inventors: Hiroshi Watanabe, Yokohama (JP);
Akira Nishiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 258 days.

(21) Appl. No.: 11/853,415

(22) Filed: Sep. 11, 2007

(65) Prior Publication Data
US 2008/0074180 A1 Mar. 27, 2008

(30) Foreign Application Priority Data
Sep. 22, 2006 (JP) ............................. 2006-257752
Jul. 17, 2007 (JP) ............................. 2007-186344

(51) Int. Cl.
*H01L 29/788* (2006.01)
(52) U.S. Cl. ....................... 257/320; 257/315
(58) Field of Classification Search ................. 257/315, 257/320
See application file for complete search history.

(56) References Cited

U.S. PATENT DOCUMENTS

| 5,760,644 | A | 6/1998 | Lancaster et al. | |
|---|---|---|---|---|
| 6,172,911 | B1 | 1/2001 | Tanaka et al. | |
| 6,856,581 | B1* | 2/2005 | Berstis et al. | ............... 368/121 |
| 7,075,284 | B2 | 7/2006 | Watanabe et al. | |
| 7,208,933 | B2 | 4/2007 | Watanabe et al. | |
| 7,224,157 | B2 | 5/2007 | Watanabe et al. | |
| 7,248,034 | B2 | 7/2007 | Watanabe et al. | |
| 2003/0122204 | A1* | 7/2003 | Nomoto et al. | ............. 257/406 |
| 2004/0149816 | A1 | 8/2004 | Tomoeda et al. | |
| 2005/0224863 | A1* | 10/2005 | Hieda et al. | .................. 257/315 |
| 2006/0087360 | A1 | 4/2006 | Watanabe | |
| 2006/0120162 | A1* | 6/2006 | Fujiu et al. | ............. 365/185.24 |
| 2006/0152208 | A1 | 7/2006 | Watanabe et al. | |
| 2007/0247915 | A1* | 10/2007 | Kalnitsky et al. | ...... 365/185.18 |

FOREIGN PATENT DOCUMENTS

| JP | 2004-172404 | 6/2004 |
|---|---|---|
| JP | 2005-310824 | 11/2005 |

OTHER PUBLICATIONS

U.S. Appl. No. 12/233,168, filed Sep. 18, 2008, Watanabe.
U.S. Appl. No. 12/049,715, filed Mar. 17, 2008, Watanabe, et al.
U.S. Appl. No. 11/845,337, filed Aug. 27, 2007, Watanabe, et al.
U.S. Appl. No. 11/845,451, filed Aug. 27, 2007, Watanabe.

* cited by examiner

*Primary Examiner*—Thao X Le
*Assistant Examiner*—Geoffrey Ida
(74) *Attorney, Agent, or Firm*—Oblon, Spivak, McClelland, Maier & Neustadt, L.L.P.

(57) ABSTRACT

A semiconductor integrated circuit according to an example of the present invention includes a semiconductor substrate, an element isolation insulating layer formed in a surface region of the semiconductor substrate, and first and second MIS type devices isolated from each other by the element isolation insulating layer and formed in adjacent first and second element regions in a second direction orthogonal to a first direction. Each of the first and second MIS type devices has a stack gate structure having a floating gate and a control gate electrode. The first MIS type device functions as an aging device, and the second MIS type device functions as a control device which controls an electric charge retention characteristic of the aging device.

24 Claims, 36 Drawing Sheets

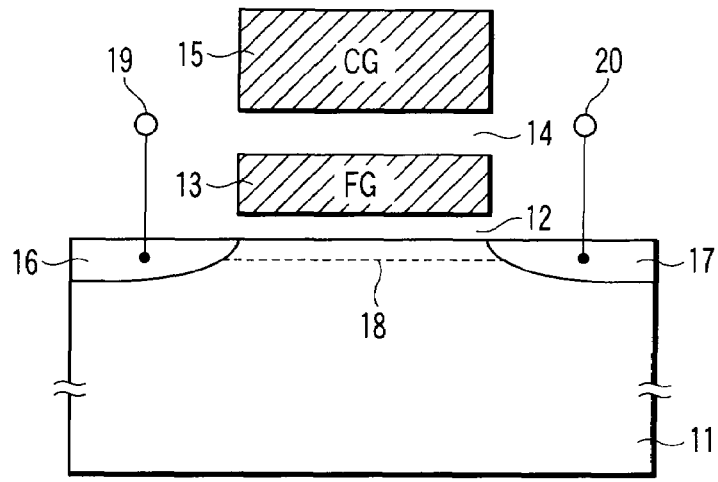
F I G. 1
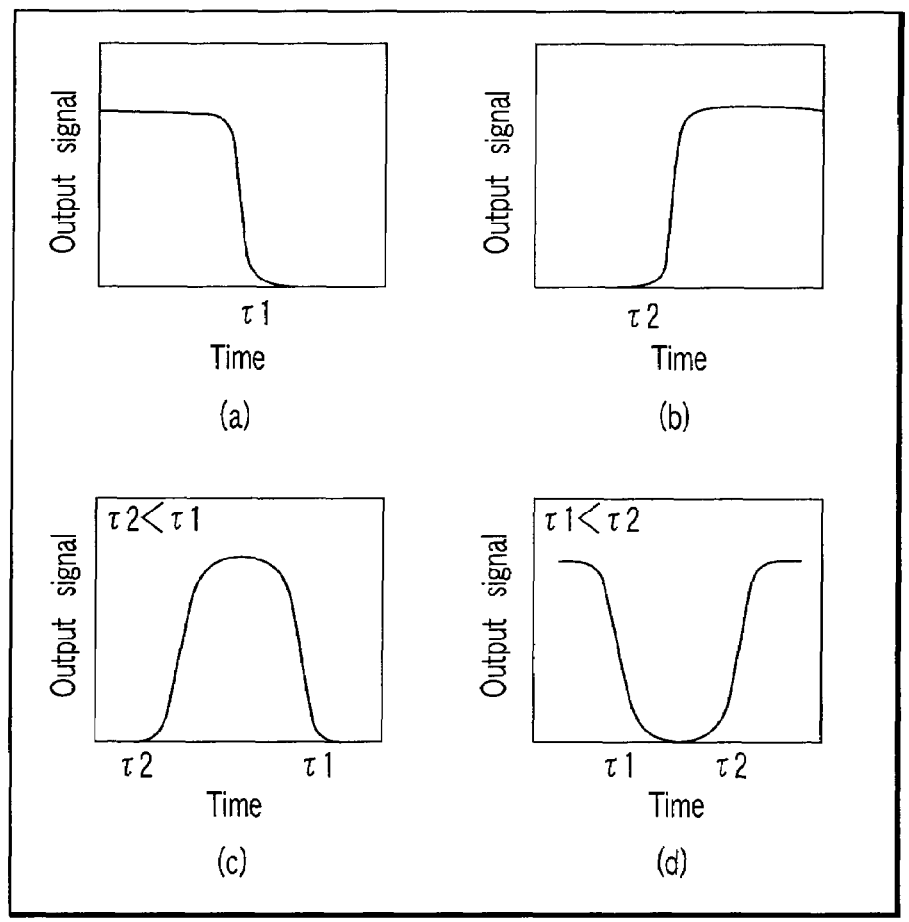
F I G. 2

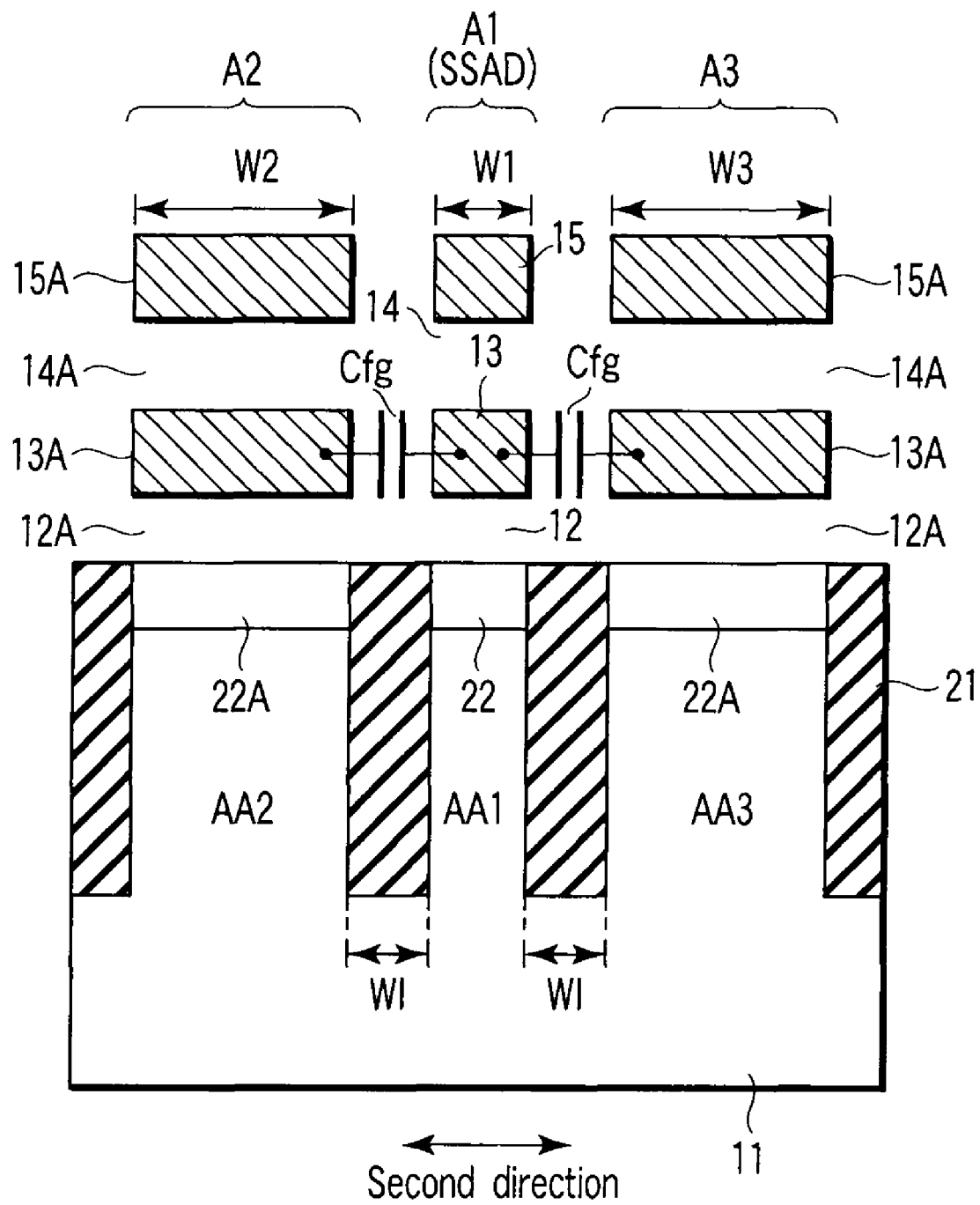
F I G. 4

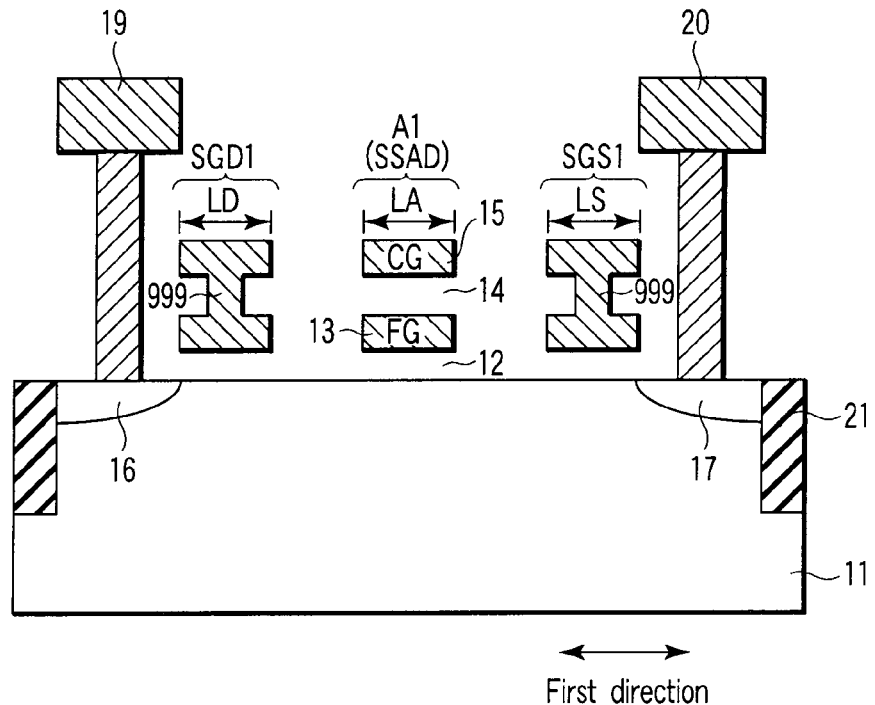
F I G. 8
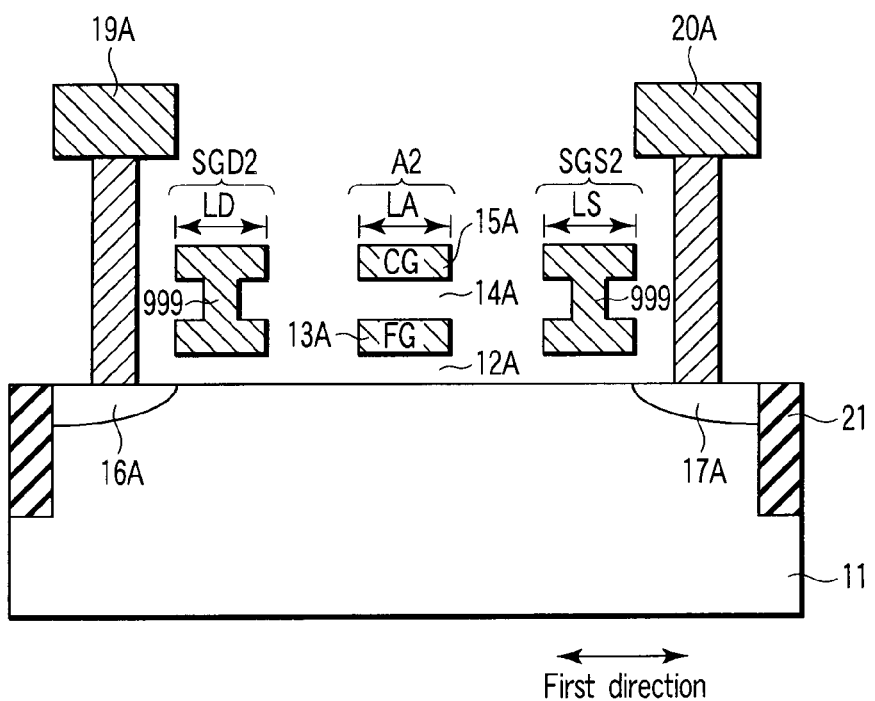
F I G. 9

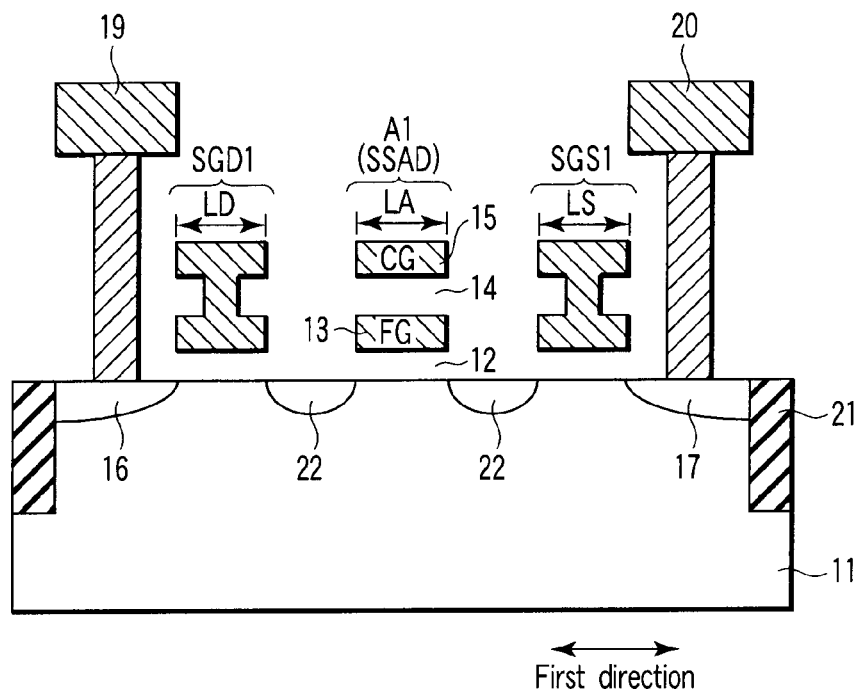
F I G. 10
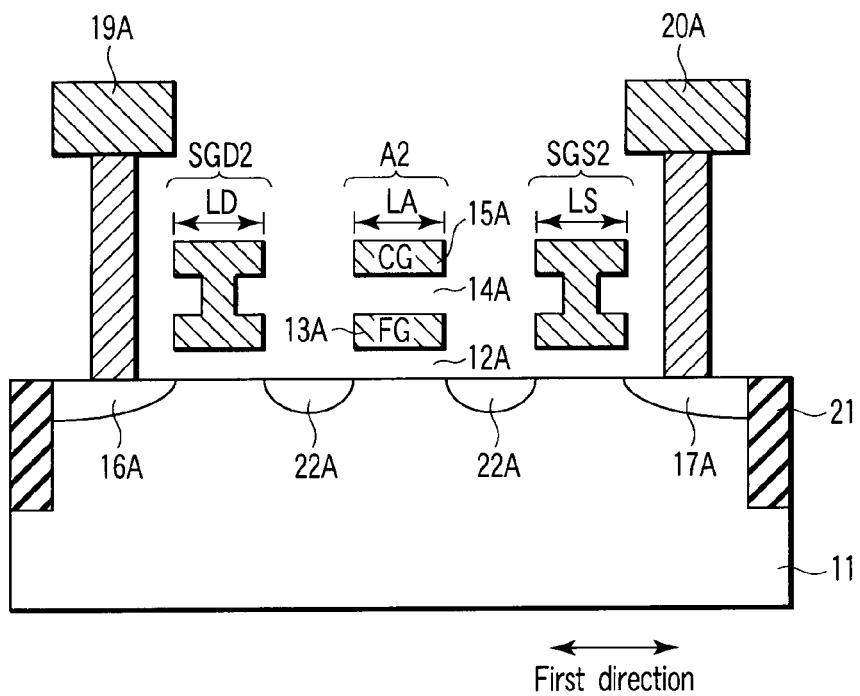
F I G. 11

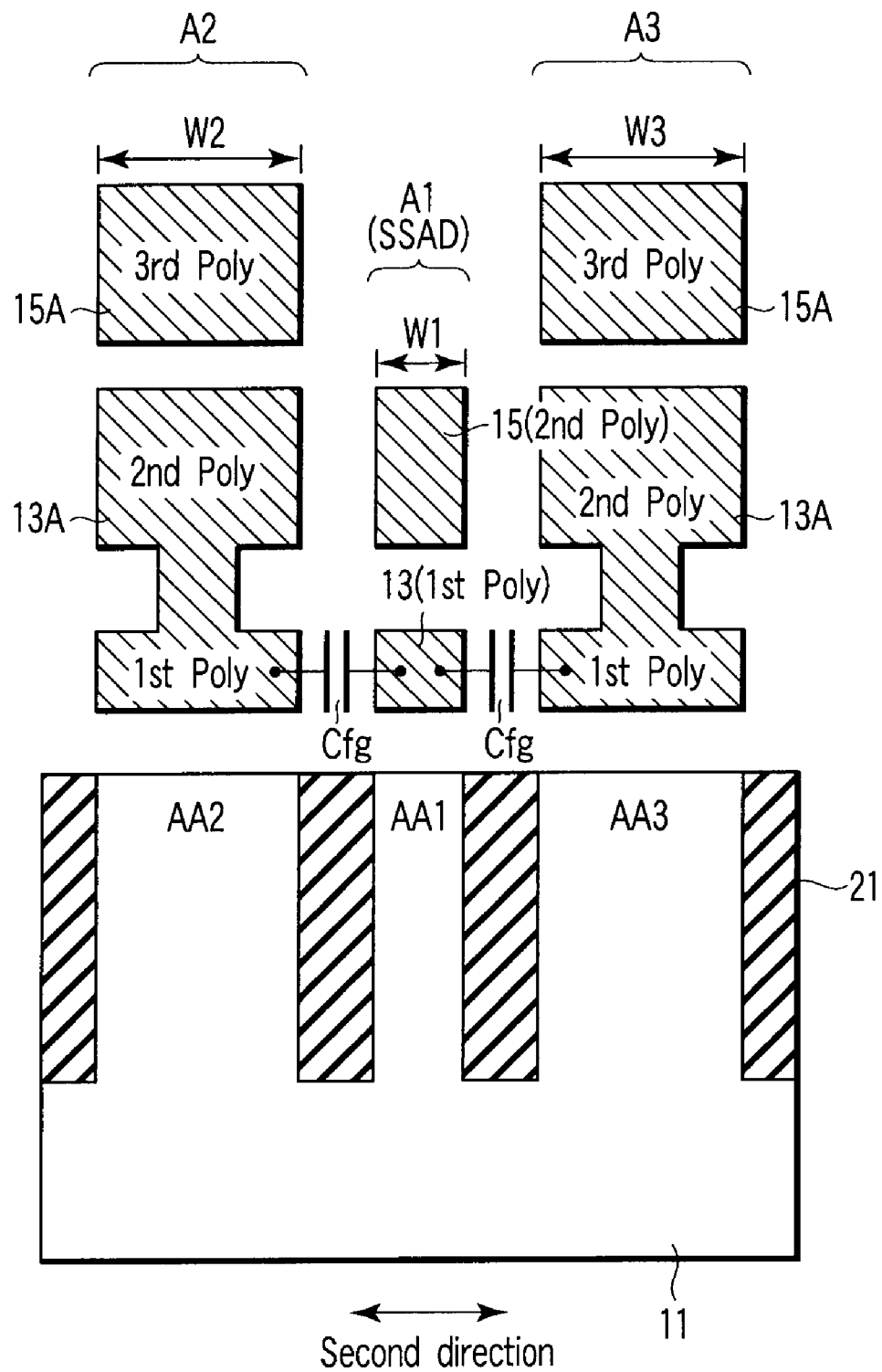
F I G. 18

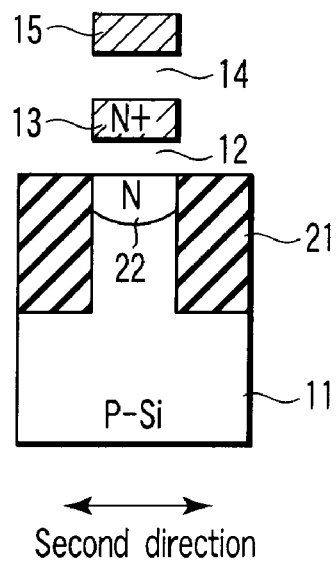
F I G. 21
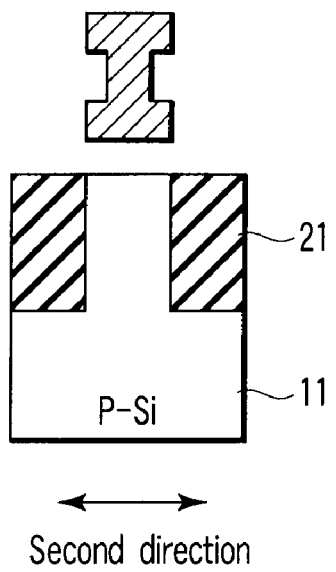
F I G. 22

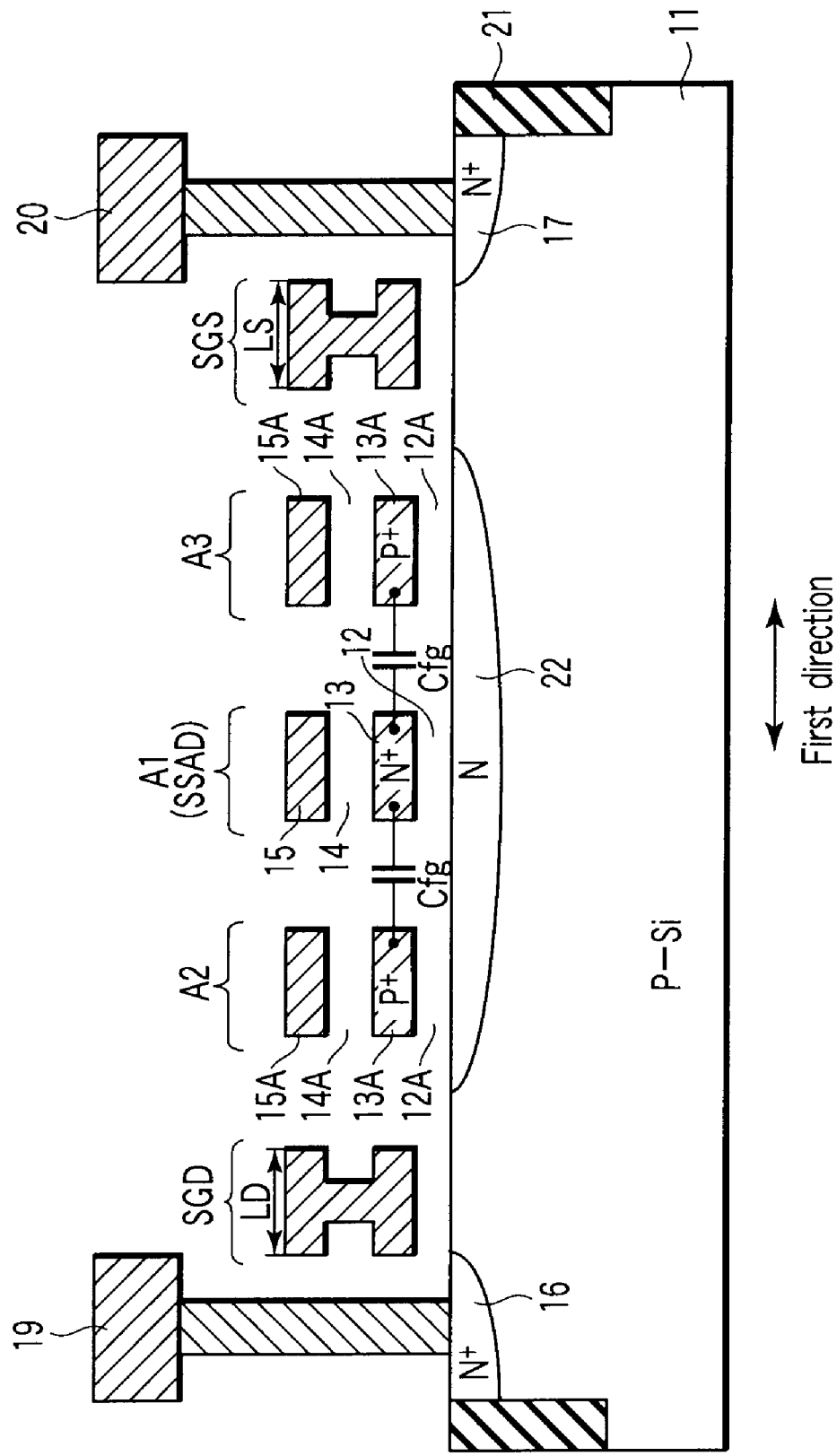
F I G. 23

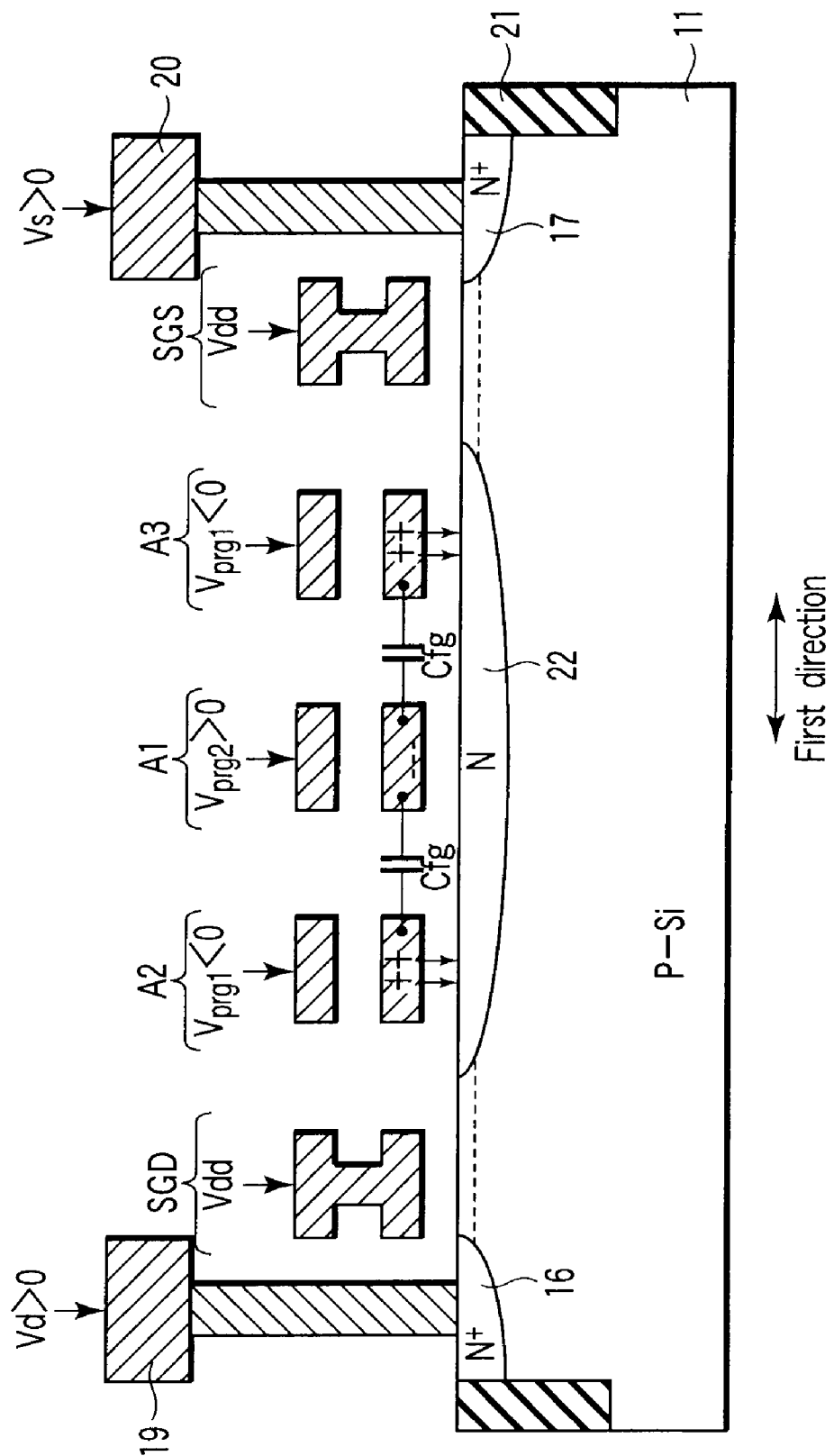
F I G. 25

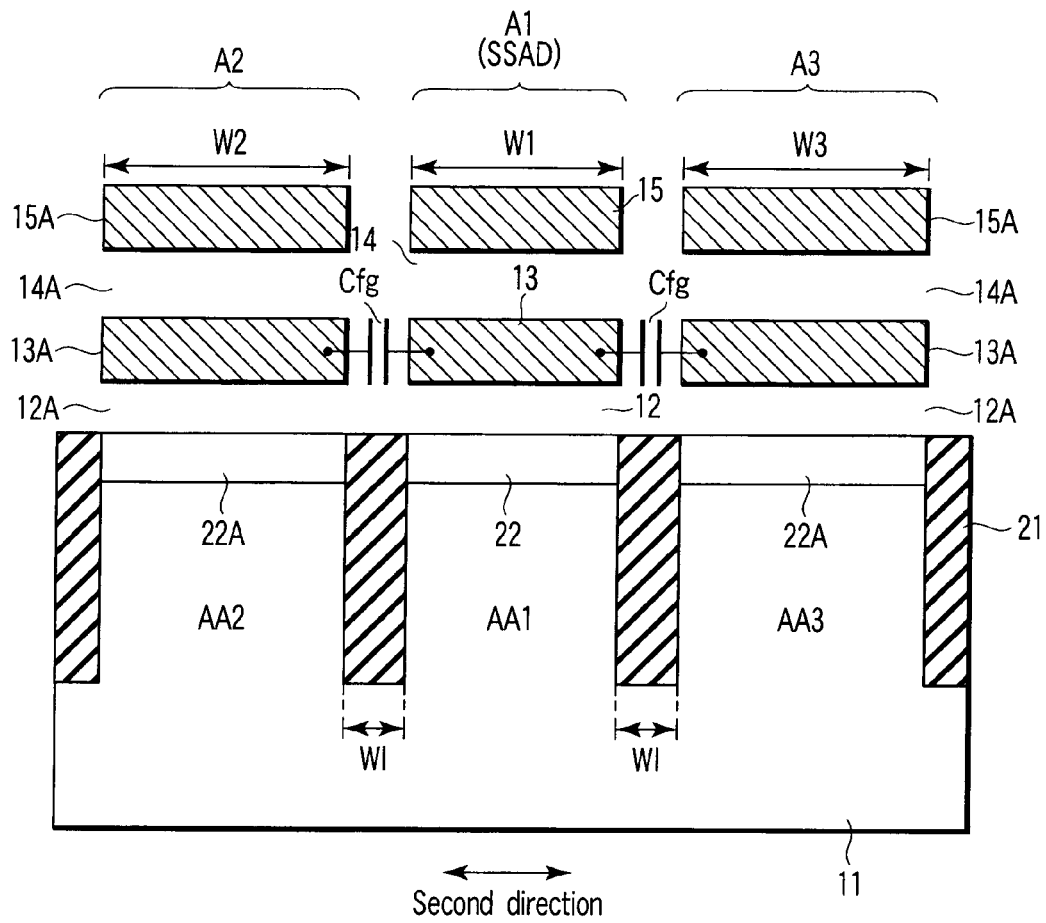
F I G. 31

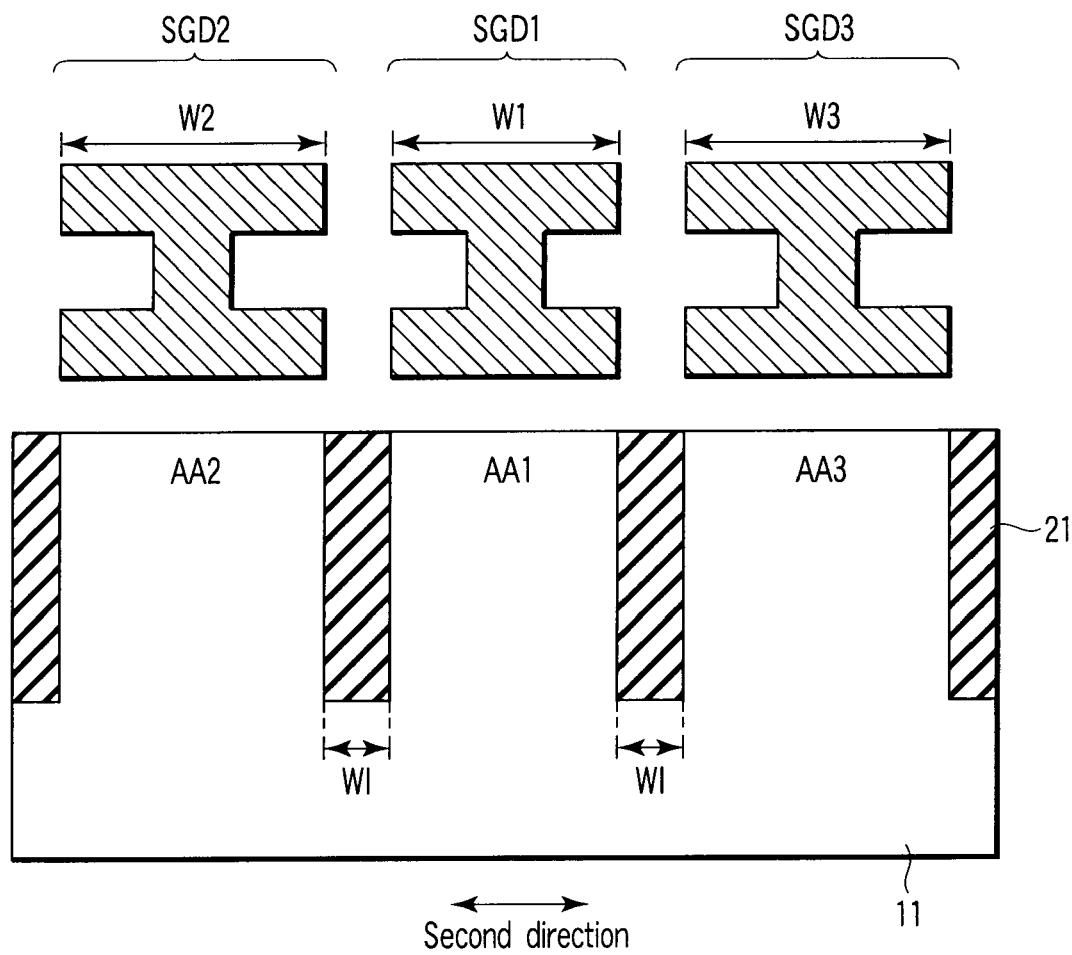
F I G. 32

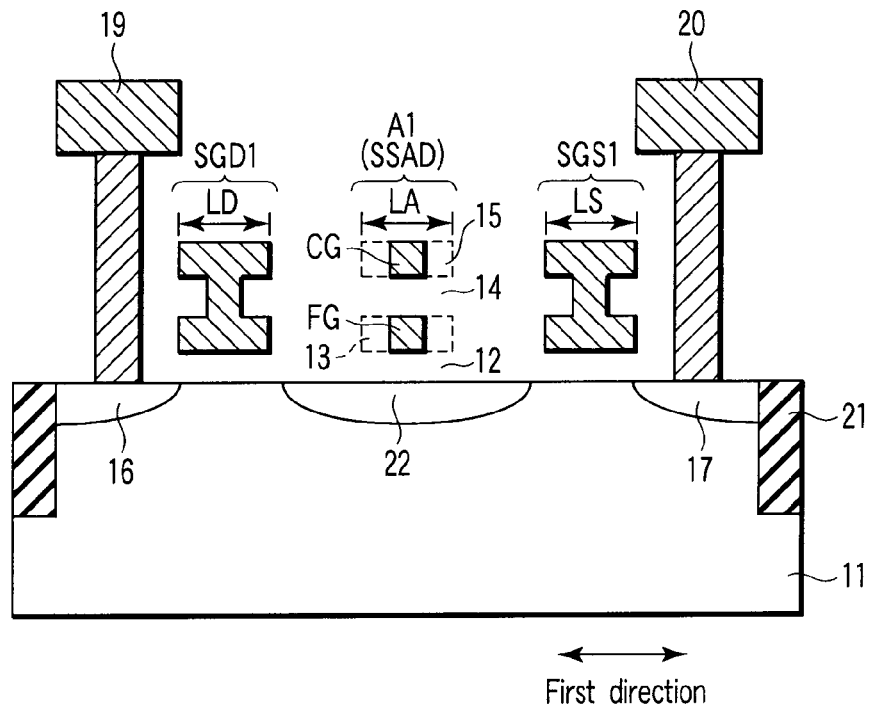
F I G. 33
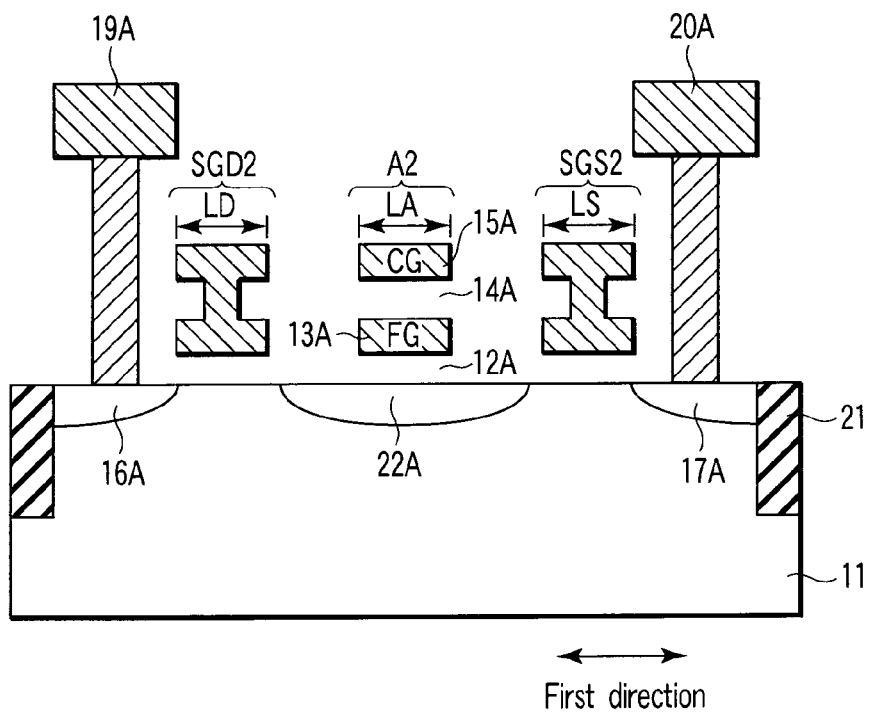
F I G. 34

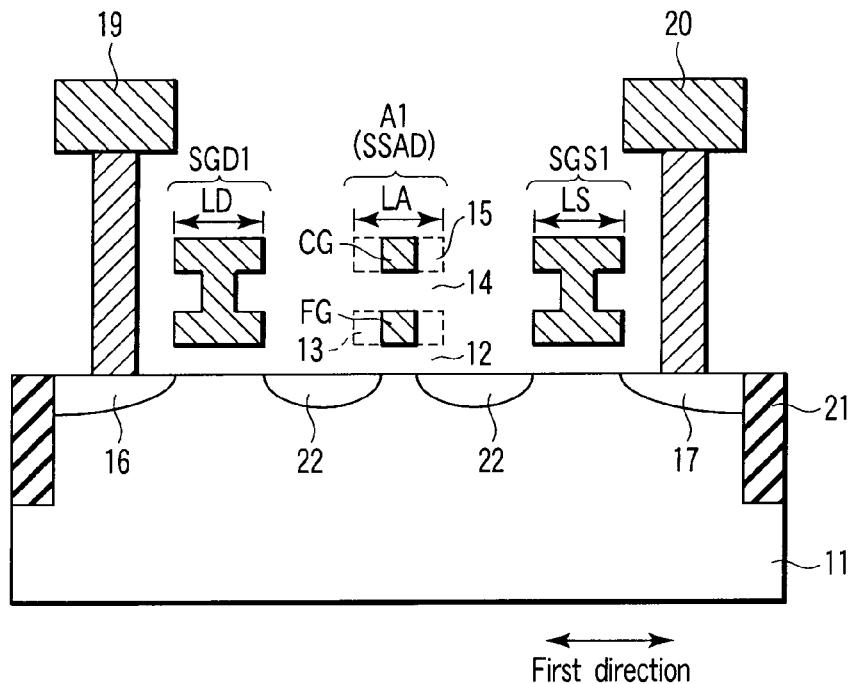
F I G. 37
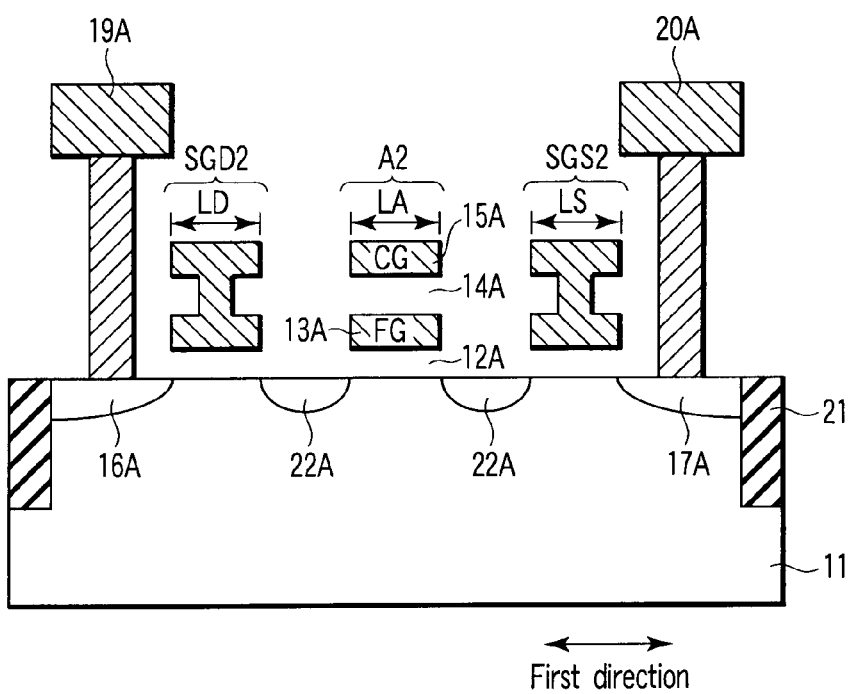
F I G. 38

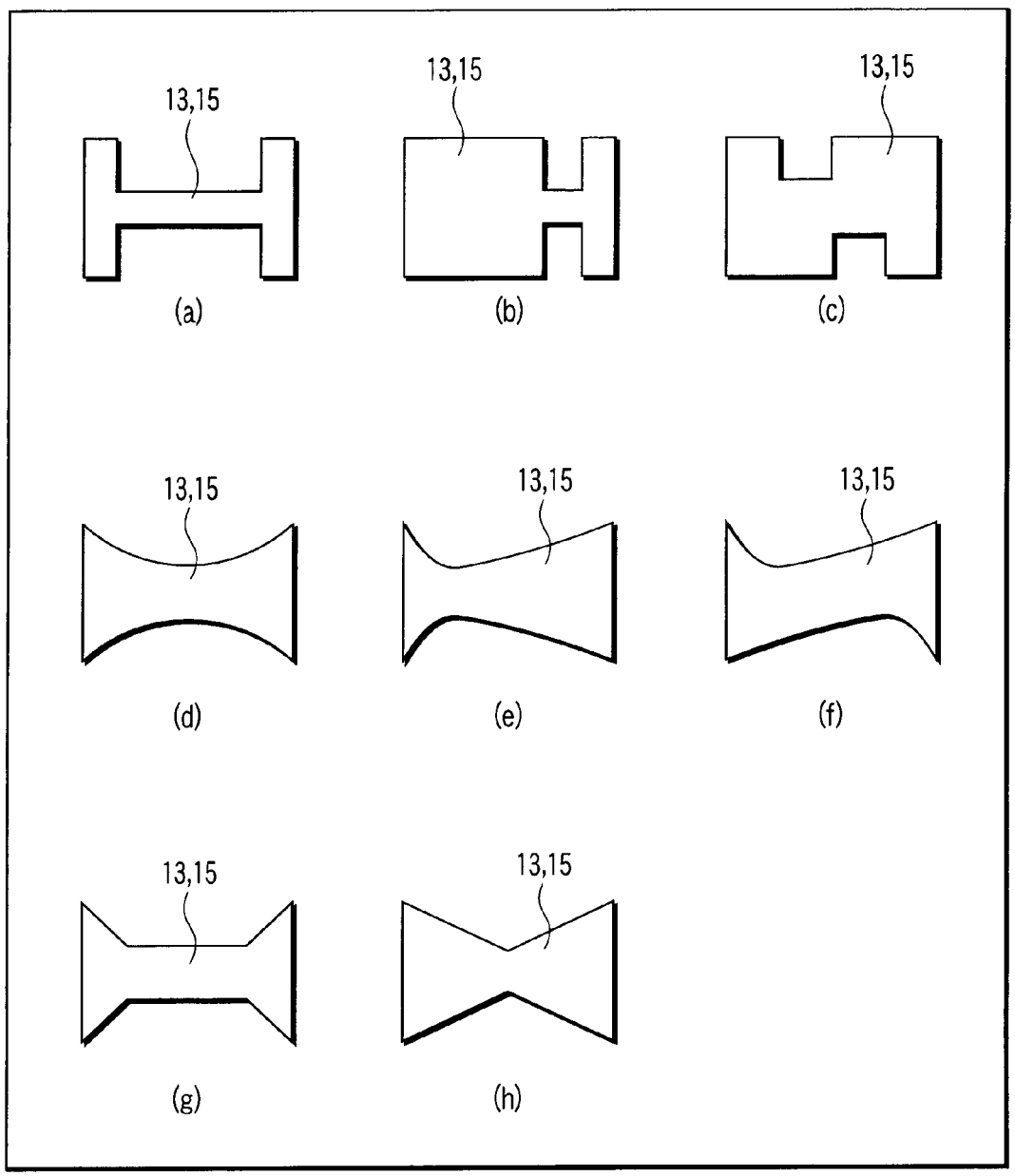
F I G. 45

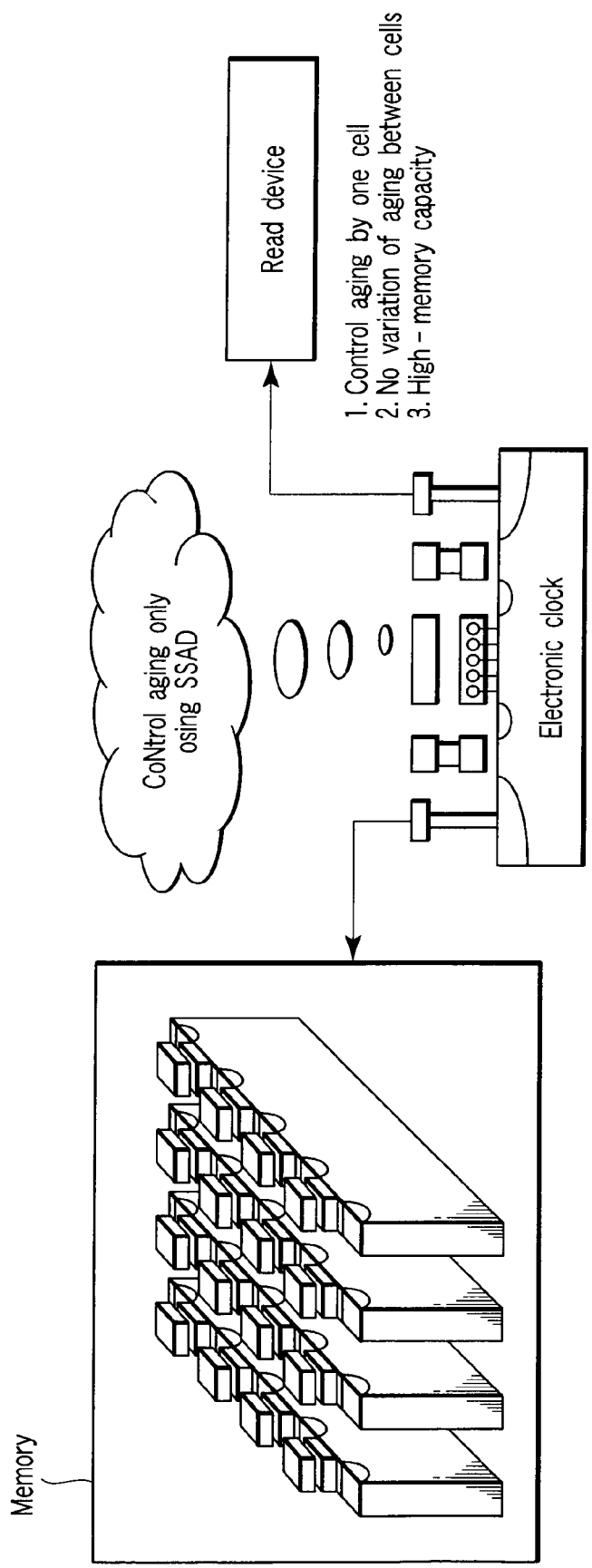
F I G. 46

SEMICONDUCTOR INTEGRATED CIRCUIT

CROSS-REFERENCE TO RELATED APPLICATIONS

This application is based upon and claims the benefit of priority from prior Japanese Patent Applications No. 2006-257752, filed Sep. 22, 2006; and No. 2007-186344, filed Jul. 17, 2007, the entire contents of both of which are incorporated herein by reference.

BACKGROUND OF THE INVENTION

1. Field of the Invention

The present invention relates to a semiconductor integrated circuit having an electronic timer being free from a battery.

2. Description of the Related Art

In recent years, an electronic timer being free from a battery, i.e., an aging device the output of which changes with elapsed time begins to be considered to be used in fields of contents distribution, credit cards, rental digital products, rental digital software, and the like.

The aging device has a stack gate structure constituted by a floating gate and a control gate electrode and functions as an electronic timer which measures a predetermined period by a retention (aging) of electric charges in the floating gate (for example, see JP-A 2004-172404 (KOKAI) and JP-A 2005-310824 (KOKAI)).

According to the aging device, for example, a tunnel insulating film is changed in thickness to make it possible to change the aging.

However, electric charge leakage from the floating gate changes depending on a manufacturing fluctuation. For this reason, in order to cause the aging device to function as an accurate electronic timer, a complex circuit to eliminate an error generated by the manufacturing fluctuation is required.

As fields in which the aging devices are used spread, the agings of the aging devices must be set to cope with business models, respectively. Since this means that a plurality of production lines of aging devices must be installed in correspondence with the agings, the production cost increases.

BRIEF SUMMARY OF THE INVENTION

A semiconductor integrated circuit according an aspect of the present invention comprises a semiconductor substrate, an element isolation insulating layer formed in a surface region of the semiconductor substrate, and first and second MIS type devices isolated from each other by the element isolation insulating layer and formed in adjacent first and second element regions in a second direction orthogonal to a first direction, wherein each of the first and second MIS type devices has a stack gate structure having a floating gate and a control gate electrode, the first MIS type device functions as an aging device, and the second MIS type device functions as a control device which controls an electric charge retention characteristic of the aging device.

A semiconductor integrated circuit according an aspect of the present invention comprises a semiconductor substrate, an element isolation insulating layer formed in a surface region of the semiconductor substrate, a diffusion layer of a first conductivity type formed in an element region surrounded by the element isolation insulating layer, first and second MIS type devices aligned in a first direction on the diffusion layer, and two select gate transistors arranged at two end portions of the diffusion layer in the first direction, respectively, wherein each of the first and second MIS type devices has a stack gate structure having a floating gate and a control gate electrode, the first MIS type device functions as an aging device, and the second MIS type device functions as a control device which controls an electric charge retention characteristic of the aging device.

BRIEF DESCRIPTION OF THE SEVERAL VIEWS OF THE DRAWING

FIG. 1 is a diagram showing a structure of a base unit;

FIG. 2 is a diagram showing four basic functions of an aging device;

FIG. 4 is a sectional view along the IV-IV line in FIG. 3;

FIG. 8 is a sectional view showing a modification of FIG. 6;

FIG. 9 is a sectional view showing a modification of FIG. 7;

FIG. 10 is a sectional view showing a modification of the first embodiment;

FIG. 11 is a sectional view showing a modification of the first embodiment;

FIG. 18 is a sectional view showing a modification of the first embodiment;

FIG. 21 is a sectional view along the XIX-XIX line in FIG. 20;

FIG. 22 is a sectional view along the XX-XX line in FIG. 20;

FIG. 23 is a sectional view along the XXI-XXI line in FIG. 20;

FIG. 25 is a sectional view showing a manner in a write-back state;

FIG. 31 is a sectional view along the XXXI-XXXI line in FIG. 30;

FIG. 32 is a sectional view along the XXXII-XXXII line in FIG. 30;

FIG. 33 is a sectional view along the XXXIII-XXXIII line in FIG. 30;

FIG. 34 is a sectional view along the XXXIV-XXXIV line in FIG. 30;

FIG. 37 is a sectional view showing a modification of FIG. 35;

FIG. 38 is a sectional view showing a modification of FIG. 36;

FIG. 45 is a diagram showing a modification of a shape of a floating gate; and

FIG. 46 is a diagram showing a system as an application.

DETAILED DESCRIPTION OF THE INVENTION

Figure 3:
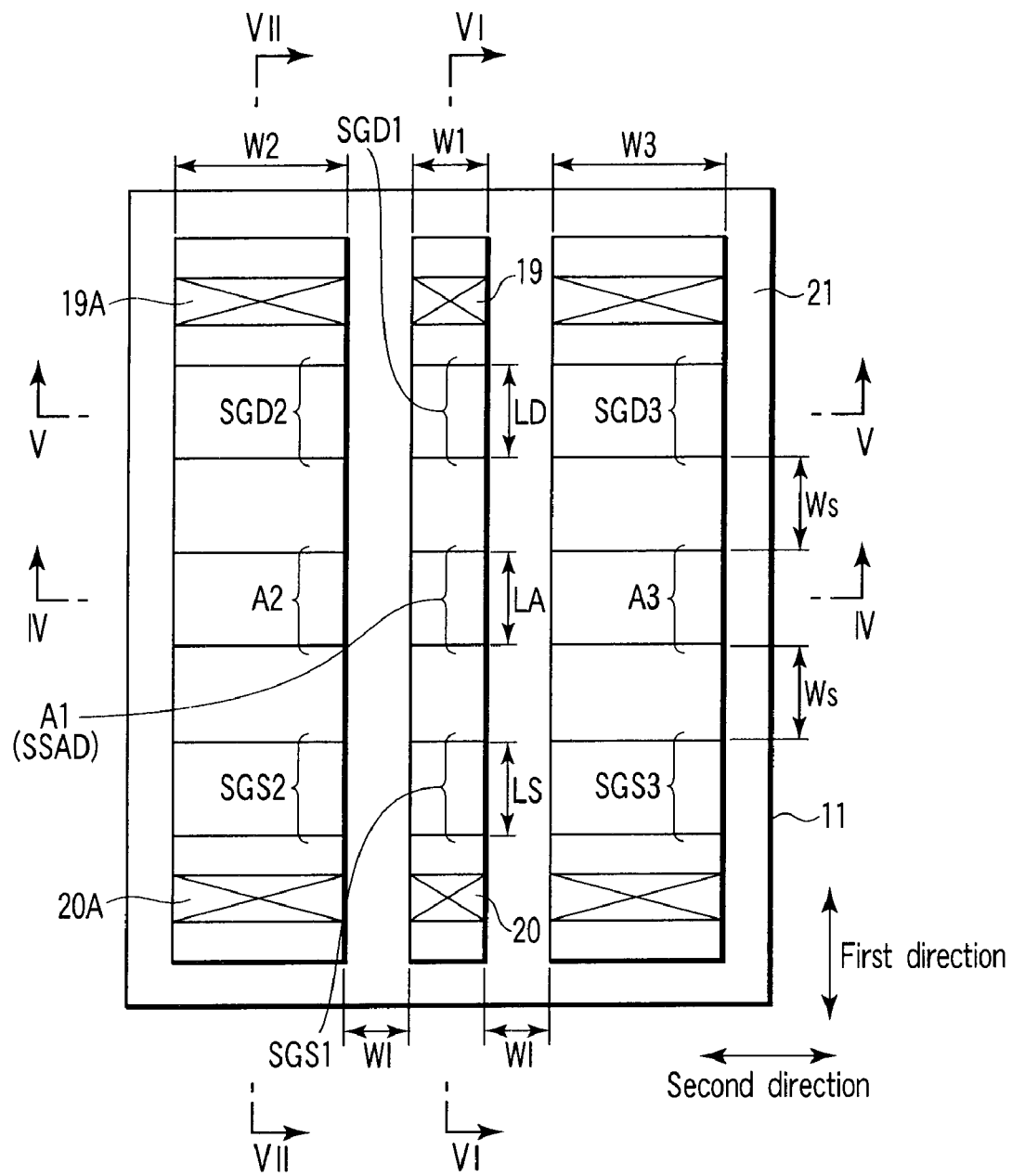
FIG. 3 is a plan view showing a semiconductor integrated circuit according to a first embodiment.

A semiconductor integrated circuit of an aspect of the present invention will be described below in detail with reference to the accompanying drawings.

1. OUTLINE

In an example of the present invention, the aging of an aging device is controlled by two control devices which sandwich the aging device, not by the thickness of a tunnel insulating film.

The aging device and the control device are constituted by MIS devices, respectively. Each of the aging device and the control device has a stack gate structure having a floating gate and a control gate electrode.

In this case, since a parasitic capacitance is generated between the floating gate of the aging device and the floating gate of the control device, the aging of the aging device can be controlled depending on the number of electric charges injected into the floating gate of the control device.

More specifically, when the number of electric charges in the floating gate of the control device is large, time required for removal of the electric charges in the floating gate of the aging device becomes short, and the aging of the aging device is shortened.

When the amount of the electric charges in the floating gate of the control device is small, on the other hand, the aging of the aging device is lengthened.

With this configuration, the aging of the aging device can be easily changed by a simple circuit without depending on the thickness of a tunnel insulating film.

In this case, like a memory cell in a flash memory, the control device has a structure in which electric charges in the floating gate do not easily leak.

For example, a channel of the aging device and a diffusion layer of the control device are formed from an impurity of the same conductivity type (n/p).

2. EMBODIMENTS (1) Aging Device

An aging device will be described first.

FIG. 1 shows an example of a base unit of the aging device.

The base unit of the aging device is constituted by a MIS device having a stack gate structure. More specifically, on a semiconductor substrate 11, a floating gate 13 is formed through a tunnel insulating film 12. On the floating gate 13, a control gate electrode 15 is formed above an inter-electrode insulating layer 14.

In this embodiment, the base unit of the aging device constitutes a MISFET. More specifically, in the semiconductor substrate 11, a drain diffusion layer 16 and a source diffusion layer 17 are formed, and the floating gate 13 is formed on a channel region 18 between the drain diffusion layer 16 and the source diffusion layer 17.

The base unit is not necessarily a MISFET.

A technique of a flash memory is used in writing (initial setting) to the base unit of the aging device. For example, a potential of the control gate electrode 15 is set to be a value sufficiently higher than a potential of the channel region 18, so that electrons are injected from the channel region 18 into the control gate electrode 15 by using FN (Fowler-Nordheim) tunneling.

In this case, the aging device measures a predetermined period of time by using aging of the number of electric charges stored in the floating gate 13, i.e., a phenomenon in which the potential of the channel region 18 changes due to leakage of electric charges. More specifically, the aging causes aging of a current (drain current Id) flowing between a drain electrode 19 and a source electrode 20.

Therefore, it is important to accurately control the number of electric charges held in the floating gate 13.

FIG. 2 shows four basic functions of the aging device.

In FIG. 2(a), when the aging device reaches the end of an aging ($\tau 1$), an output signal which has existed until now should be eliminated. In this case, the aging of the aging device is a period of time from writing (initial setting) to a change of an output signal by electric charge leakage, and depends on an electric charge retention property.

In FIG. 2(b), when the aging device reaches the end of an aging ($\tau 2$), an output signal which has not existed is generated.

In FIG. 2(c), when the aging device reaches the end of a first aging ($\tau 2$), an output signal which has not existed is generated. When the aging device reaches the end of a second aging ($\tau 1$), the output signal which has existed until now is eliminated.

Here, it is understood that a point of time at which an output signal changes due to electric charge leakage is not limited to one specific point. More specifically, for example, when an aging device is structured by combining a plurality of base units, a plurality of agings can be given to the aging device.

In FIG. 2(d), when the aging device reaches the end of the first aging ($\tau 1$), the output signal which has existed is eliminated. When the aging device reaches the end of the second aging ($\tau 2$), the output signal which has not existed is generated.

In this case, the elimination of an output signal means sharp attenuation.

As mechanisms which cause the aging device to measure a predetermined period of time, as shown in Table 1, four types of mechanisms are present in consideration of base units.

TABLE 1

|  | Expression of forgetting | | Expression of remembering | |
|---|---|---|---|---|
|  | pMOSFET | nMOSFET | pMOSFET | nMOSFET |
| Type | Normally-off | | Normally-on | |
| Operation | On → off | | Off → on | |
| Charge | Electron | Hole | Hole | Electron |

A normally-on type realizes a function called "remembering", while a normally-off type realizes "forgetting".

In the normally-off type, electrons (p-channel MOSFET) or holes (n-channel MOSFET) are stored in a floating gate by writing (initial setting) to turn on a transistor (base unit).

With elapse of time after a writing state, the electrons or the holes leak from the floating gate, and the transistor is changed from an on state to an off state at a certain point of time. At this time, the output signal is as shown in FIG. 2(a).

In the normally-on type, electrons (n-channel MOSFET) or holes (p-channel MOSFET) are stored in a floating gate in writing (initial setting) to turn off the transistor (base unit).

With elapse of time after a writing state, the electrons or the holes leak from the floating gate, and the transistor is changed from an off state to an on state at a certain point of time. At this time, the output signal is as shown in FIG. 2(b).

The function shown in FIG. 2(c) can be realized by connecting a normally-on type base unit having a short aging and a normally-off type base unit having a long aging in series with each other. The function in FIG. 2(d) can be realized by connecting a normally-off type base unit having a short aging and a normally-on type base unit having a long aging in parallel to each other.

(2) First Embodiment

A. Structure

FIG. 3 shows a plan view of a semiconductor integrated circuit according to a first embodiment.

Figure 5:
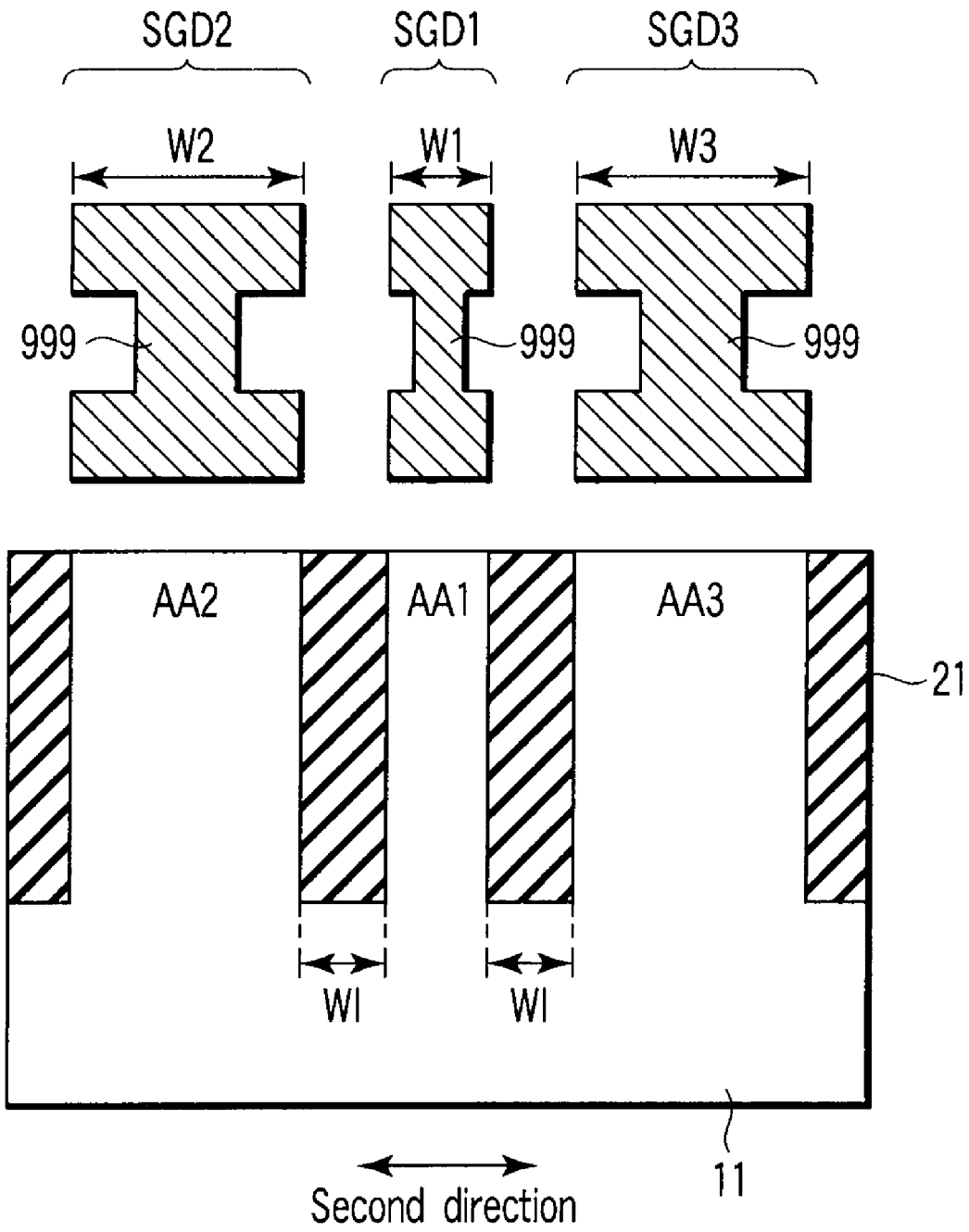
FIG. 5 is a sectional view along the V-V line in FIG. 3.
Figure 6:
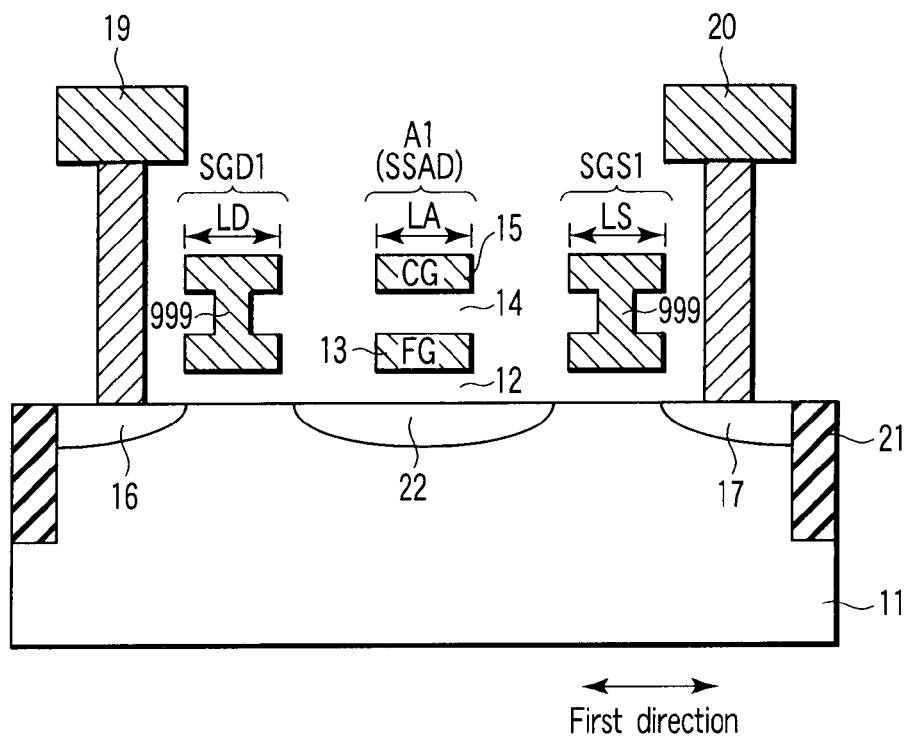
FIG. 6 is a sectional view along the VI-VI line in FIG. 3.
Figure 7:
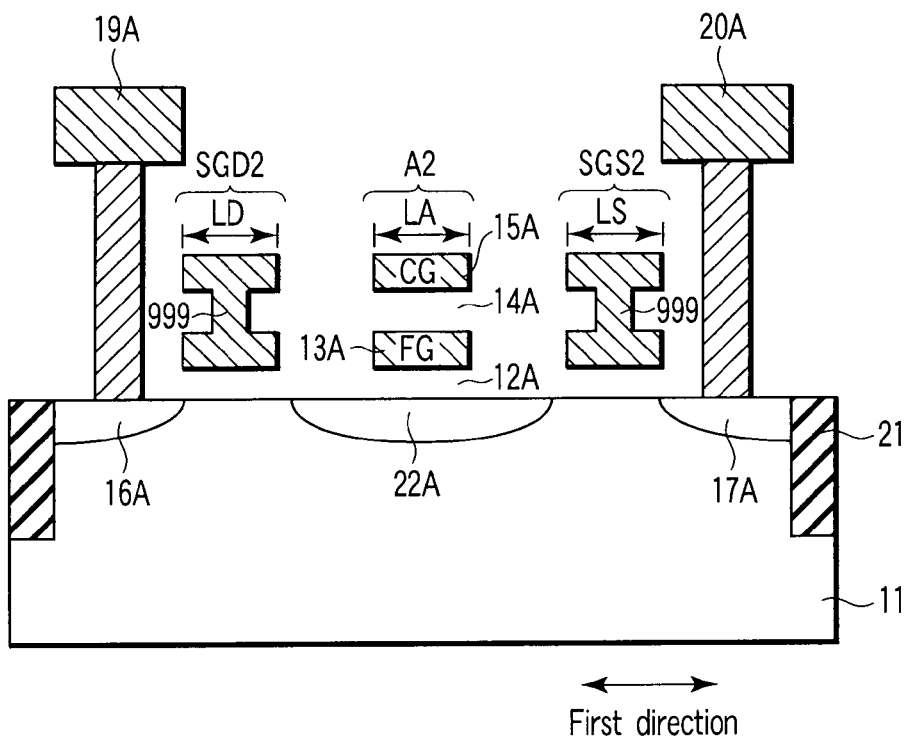
FIG. 7 is a sectional view along the VII-VII line in FIG. 3.

FIG. 4 is a sectional view along the IV-IV line in FIG. 3, FIG. 5 is a sectional view along the V-V line in FIG. 3, FIG. 6 is a sectional view along the VI-VI line in FIG. 3, and FIG. 7 is a sectional view along the VII-VII line in FIG. 3.

In a semiconductor substrate 11, an element isolation insulating layer 21 having an STI (shallow trench isolation) structure is formed. First, second, and third element regions (active areas) AA1, AA2, and AA3 are isolated from each other by the element isolation insulating layer 21 and adjacently arranged in a second direction orthogonal to a first direction.

A width W1 in the second direction of the first element region AA1 is laid out to be smaller than widths W2 and W3 in the second direction of the second and third element regions AA2 and AA3.

In the first element region AA1, a first MIS type device A1 (SSAD: solid state aging device) functioning as an aging device and two select gate transistors SGD1 and SGS1 sandwiching the first MIS type device A1 are arranged. The first MIS type device A1 and the two select gate transistors SGD1 and SGS1 are connected in series with each other.

The first MIS type device A1 has a stack gate structure. More specifically, a floating gate (FG) 13 is formed on the semiconductor substrate 11 through a tunnel insulating film 12, and a control gate electrode (CG) 15 is formed on the floating gate 13 through an inter-electrode insulating layer 14.

The width W1 of the floating gate 13 in the second direction is laid out to be shorter than a length LA of the floating gate 13 in the first direction.

In the semiconductor substrate 11 immediately below the first MIS type device A1, a diffusion layer 22 is formed.

A drain diffusion layer 16 of the select gate transistor SGD1 is connected to a drain electrode 19 through a contact plug. A source diffusion layer 17 of the select gate transistor SGS1 is connected to a source electrode 20 through a contact plug.

The widths W1 of the gate electrodes of the select gate transistors SGD1 and SGS1 in the second direction are laid out to be shorter than lengths LD and LS of the gate electrodes of the select gate transistors SGD1 and SGS1 in the first direction.

In the second element region AA2, a second MIS type device A2 functioning as a control device and two select gate transistors SGD2 and SGS2 sandwiching the second MIS type device A2 are arranged. The second MIS type device A2 and the two select gate transistors SGD2 and SGS2 are connected in series with each other.

The second MIS type device A2, like the first MIS type device A1, has a stack gate structure. More specifically, on the semiconductor substrate 11, a floating gate (FG) 13A is formed through a tunnel insulating film 12A. On the floating gate 13A, a control gate electrode (CG) 15A is formed through an inter-electrode insulating layer 14A.

A width W2 of the floating gate 13A in the second direction is laid out to be larger than a length LA of the floating gate 13A in the first direction.

In the semiconductor substrate 11 immediately below the second MIS type device A2, a diffusion layer 22A is formed.

A drain diffusion layer 16A of the select gate transistor SGD2 is connected to a drain electrode 19A through a contact plug. A source diffusion layer 17A of the select gate transistor SGS2 is connected to a source electrode 20A through a contact plug.

In the third element region AA3, a third MIS type device A3 functioning as a control device and two select gate transistors SGD3 and SGS3 sandwiching the third MIS type device A3 are arranged. The third MIS type device A3 and the two select gate transistors SGD3 and SGS3 are connected in series with each other.

The structure of the third MIS type device A3 is the same as that of the second MIS type device A2, and the structures of the two select gate transistors SGD3 and SGS3 sandwiching the third MIS type device A3 are the same as those of the two select gate transistors SGD2 and SGS2 sandwiching the second MIS type device A2, so that descriptions of the structures will be omitted.

In the semiconductor integrated circuit, the control gate electrodes (CG) 15 and 15A of the first, second, and third MIS type devices A1, A2, and A3 are independently controlled.

A width WI of the element isolation insulating layer 21 between the first and second element regions AA1 and AA2 in the second direction is laid out to be smaller than widths Ws in the first direction between one gate electrode of the select gate transistors SGD1, SGS1, SGD2, and SGS2 and the floating gates (FG) 13 and 13A of the first and second MIS type devices A1 and A2.

Similarly, a width WI of the element isolation insulating layer 21 between the first and third element regions AA1 and AA3 in the second direction is laid out to be smaller than widths Ws in the first direction between one gate electrode of the select gate transistors SGD1, SGS1, SGD3, and SGS3 and the floating gates (FG) 13 and 13A of the first and third MIS type devices A1 and A3.

Lengths LA of the floating gates (FG) 13 and 13A of the first, second, and third MIS type devices A1, A2, and A3 in the first direction are laid out to be equal to each other, and lengths LD and LS of the gate electrodes of the select gate transistors SGD1, SGS1, SGD2, SGS2, SGD3, and SGS3 are laid out to be equal to each other.

The select gate transistors SGD1, SGS1, SGD2, SGS2, SGD3, and SGS3, like the first, second, and third MIS type devices A1, A2, and A3, have stack gate structures. However, upper gate electrodes and lower gate electrodes are connected to each other by conductive plugs 999.

The semiconductor integrated circuit can be easily formed by using manufacturing processes for a flash memory. However, since the control gate electrodes (CG) 15 and 15A of the first, second, and third MIS type devices A1, A2, and A3 must be isolated from each other, mask patterns must be different from those of flash memory.

In the semiconductor integrated circuits in FIGS. 6 and 7, the MIS type devices A1, A2, and A3 do not constitute MISFETs. However, for example, as shown in FIGS. 10 and 11, the MIS type devices A1, A2, and A3 can also constitute MISFETs.

FIGS. 8 and 9 are obtained by removing the diffusion layers 22 and 22A from FIGS. 6 and 7. In the configurations, predetermined functions of an aging device can be realized.

FIGS. 10 and 11 are sectional views along the first direction corresponding to FIGS. 6 and 7. Since sectional views along the second direction are the same as FIGS. 4 and 5, a description thereof will be omitted.

B. Operation

In the semiconductor integrated circuit in FIGS. 3 to 7, the MIS type devices A2 and A3 are used as control devices to control the aging of the MIS type device (aging device) A1. In this control, a capacitive coupling Cfg between the floating gates 13 and 13A is used.

A leakage current from the floating gate 13 is determined by a self-potential of the floating gate 13. On the other hand, by using the capacitive coupling Cfg, the floating gate 13A of the control devices A2 and A3 can control the self-potential of the floating gate 13 of the aging device.

Therefore, the numbers of electric charges in the floating gates 13A of the MIS type devices A2 and A3 serving as control devices are adjusted to control the self-potentials of the floating gates 13. In this manner, an amount of leakage of electric charges from the floating gate 13 of the aging device A1 can be controlled.

In order to improve the controllability of the aging of the aging device A1 by the control devices A2 and A3, the capacitive coupling Cfg must be sufficiently large.

Although several methods are considered as the methods of improving the controllability, three typical methods will be described below.

i) The width WI of the element isolation insulating layer (for example, STI) 21 in the second direction is decreased as much as possible. This shortens the distance between the floating gates 13 and 13A to increase the capacitive coupling Cfg.

ii) The gate length (length in the first direction) LA of the floating gate 13 of the aging device A1 is increased as much as possible. This increases an area where the floating gates 13 and 13A face each other to strength the capacitive coupling Cfg.

iii) An insulating layer having a high dielectric constant is arranged between the floating gates 13 and 13A. This increases the dielectric constant of the insulating layer between the floating gates 13 and 13A to increase the capacitive coupling Cfg.

When the method iii) of the above methods is employed, matching with a process for another region (for example, a memory cell) may be damaged. Therefore, it is important for selecting any one of the methods that a method supposed to be necessary is arbitrarily selected and employed from, for example, the methods i) to iii) in consideration of fabrication-process condition.

Writing (initial setting) is performed, as in a flash memory, by injecting electric charges into the floating gates 13 and 13A of the MIS type devices A1, A2, and A3.

For example, after electric charges are injected into the floating gates 13A of the control devices A2 and A3 by FN tunneling, electric charges are injected into the floating gate 13 of the aging device A1.

Writing operations in the control devices A2 and A3 will be performed as follows. For example, when electrons are to be injected, at least one of the drain-side select gate transistors SGD2 and SGD3 and the source-side select gate transistors SGS2 and SGS3 is turned on, a potential of the source or the drain is transferred to the diffusion layer 22A, and a further write potential is supplied to the control gate electrode 15A.

The writing operations in the control devices A2 and A3 may be simultaneously performed or independently performed.

A writing operation in the aging device A1 will be performed as follows. For example, when electrons are to be injected, at least one of the drain-side select gate transistor SGD1 and the source-side select gate transistor SGS1 is turned on, the potential of the source or the drain is transferred to the diffusion layer 22, and a further write potential is supplied to the control gate electrode 15.

In the writing, the number of electric charges injected into the floating gates 13 and 13A can be controlled by a verify technique.

Figure 12:
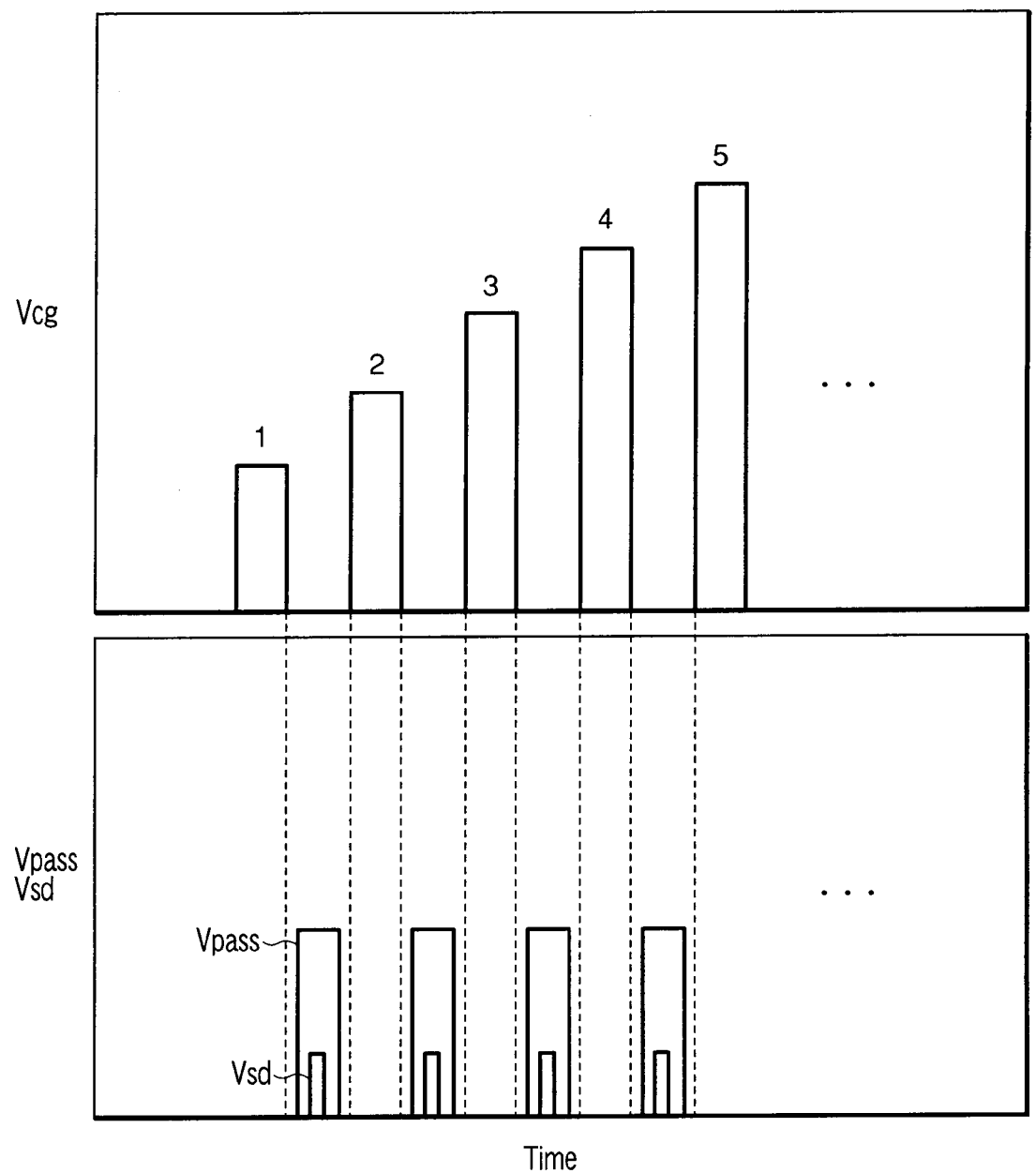
FIG. 12 is a diagram showing an example of step-up writing.

FIG. 12 shows a technique that gradually increases a write potential Vcg to control the number of electric charges injected into the floating gates 13 and 13A.

Rectangular pulses 1, 2, 3, 4, 5, . . . the magnitudes of which gradually change are applied to the control gate electrodes 15 and 15A at predetermined intervals.

In the intervals between the rectangular pulses 1, 2, 3, 4, 5, . . . , voltages Vpass to turn on the select gate transistors SGD1, SGS1, SGD2, SGS2, SGD3, and SGS3 are applied. However, the voltage Vpass is generally smaller than the write potential Vcg. While the voltage Vpass is applied, a read pulse Vsd is applied between the source and the drain.

Depending on read data, the numbers of electric charges stored in the floating gates 13 and 13A can be investigated. For this reason, the numbers of electric charges can be accurately controlled.

When the read data does not reach an expected value, the rectangular pulses (Vcg) 1, 2, 3, 4, 5, . . . to write data are supplied to the control gate electrodes 15 and 15A, or the voltage Vpass is supplied to the select gate transistors SGD1, SGS1, SGD2, SGS2, SGD3, and SGS3, until the read data reaches the expected value.

While the voltage Vpass is applied, the read voltage Vsd is applied between the source and the drain. In this example, after writing in the MIS type devices A2 and A3, writing in the MIS type device A1 is executed. However, even if this order is reversed, the same effect can be obtained.

When the read data reaches the expected value, the writing is ended.

In the example, it is important that maximum values are set to prevent the rectangular pulses 1, 2, 3, 4, 5, ... from being excessively large. When the rectangular pulses 1, 2, 3, 4, 5, ... reach the maximum values, if the read data are not the expected values, after all the data are reset, writing is performed again, or a writing failure is determined.

Figure 13:
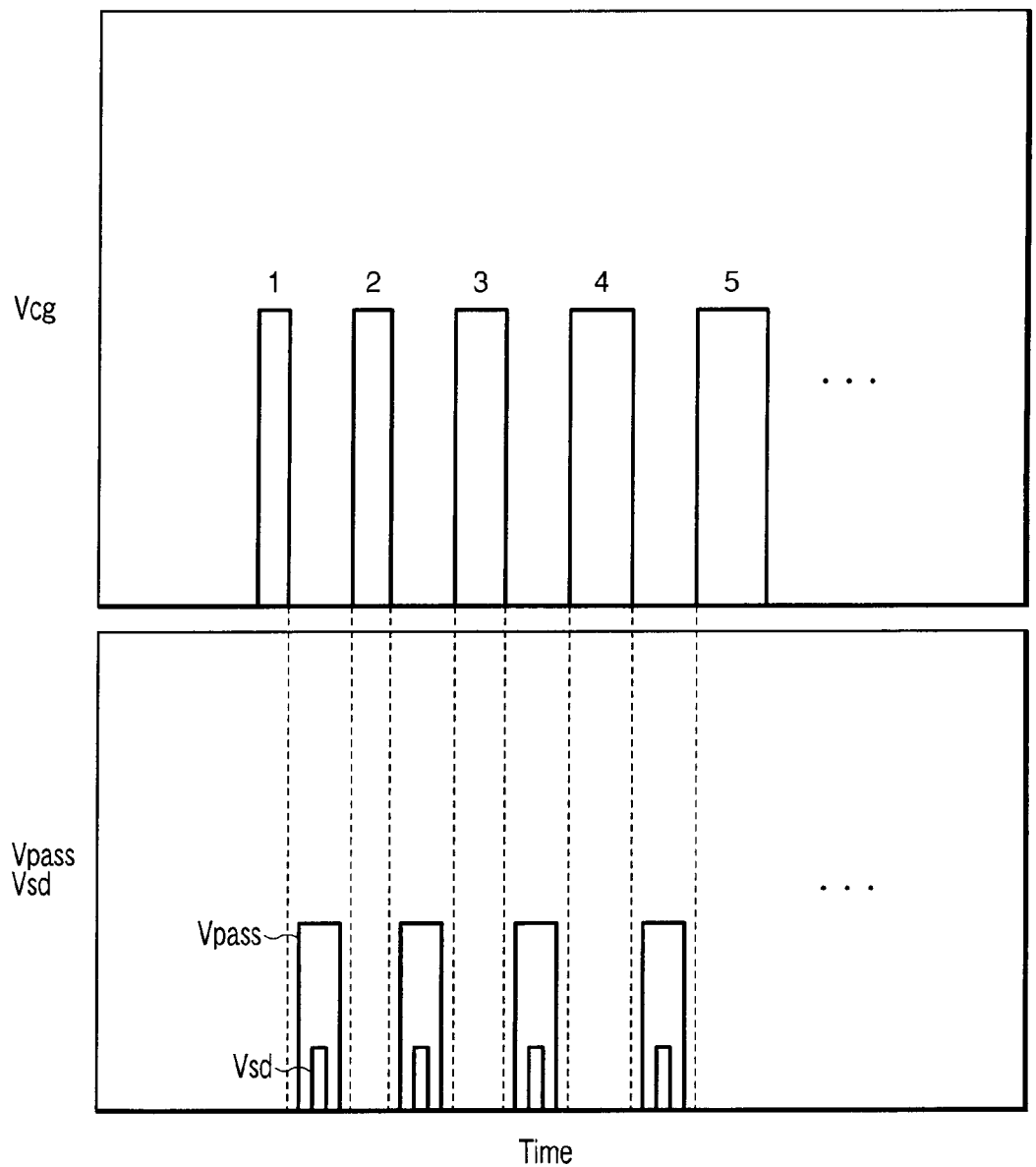
FIG. 13 is a diagram showing an example of step-up writing.

As a verify technique, in addition to FIG. 12, as shown in FIG. 13, there is a technique that gradually increases a period of the write potential Vcg. In this case, the rectangular pulses 1, 2, 3, 4, 5, ... the ranges of which gradually change are applied to the control gate electrodes 15 and 15A at predetermined intervals.

Figure 14:
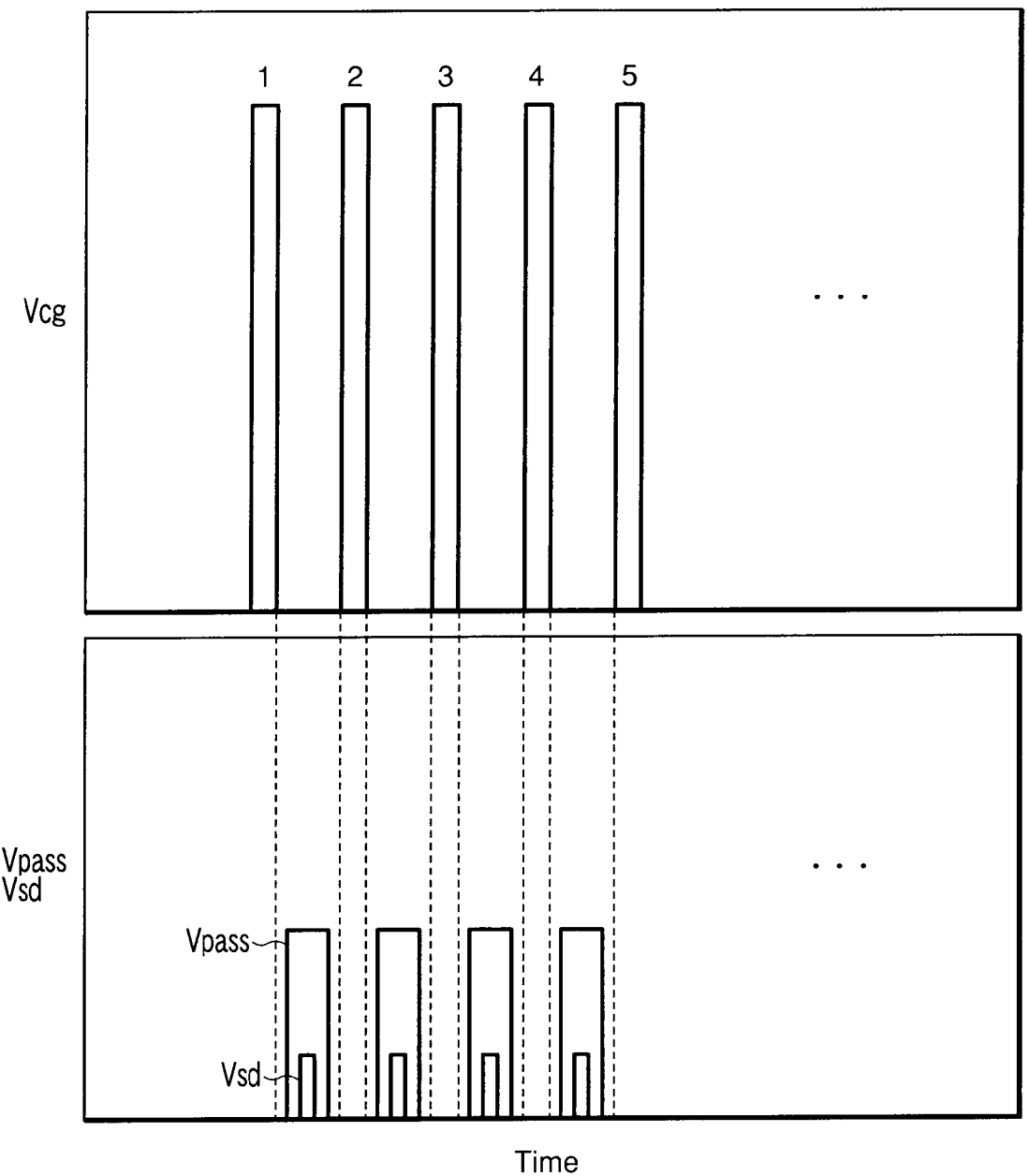
FIG. 14 is a diagram showing an example of step-up writing.

As shown in FIG. 14, the rectangular pulses 1, 2, 3, 4, 5, ... in which the magnitudes and the ranges of the write potentials Vcg are constant may be applied to the control gate electrodes 15 and 15A at predetermined intervals.

In this manner, by using the verify technique, the numbers of electric charges injected into the floating gates 13 and 13A can be accurately controlled for the aging device A1 and the control devices A2 and A3.

Therefore, the controllability of the control devices can be improved, and an error of the aging of the aging device can also be decreased.

C. Controllability of Aging

In order to improve the controllability of the aging of the aging device, the aging of the control device must be longer than the aging of the aging device.

For this purpose, the thickness of the tunnel insulating film of the control device may be larger than the thickness of the tunnel insulating film of the aging device. However, in order to prevent a film-forming process from being complicated, the thicknesses of the tunnel insulating films of the control device and the aging device are made equal to each other, and the following configuration is used as an effective means.

The volume of the floating gate of the control device is made larger than the volume of the floating gate of the aging device.

The conductivity type of the floating gate is made different from the conductivity type of a diffusion layer in the semiconductor substrate immediately below the floating gate in the control devices, and the conductivity type of the floating gate is made equal to the conductivity type of the diffusion layer in the semiconductor substrate immediately below the floating gate in the aging device.

Since the former is obvious, the reason why the latter is effective will be described below.

The agings of the aging device and the control device are determined by amounts of leakage of electric charges from the floating gates.

Figure 15:
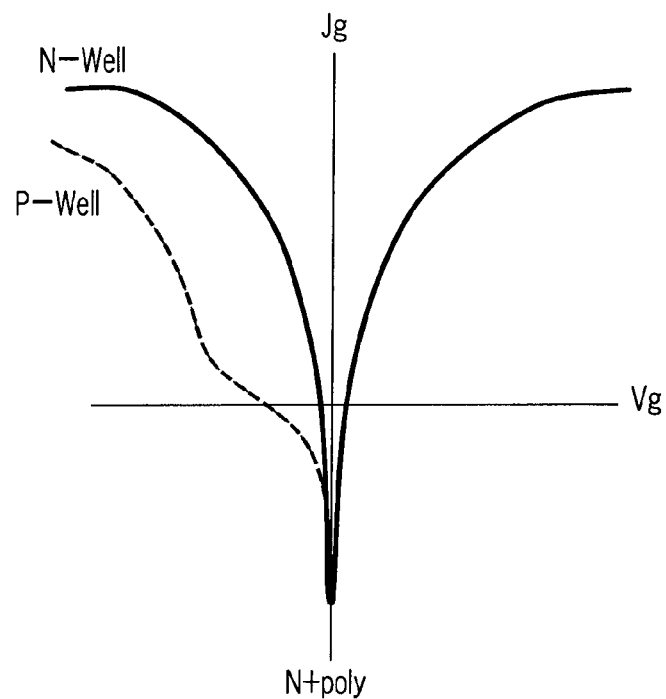
FIG. 15 is a graph showing a JV (leakage) characteristic of a MOS capacitor.
Figure 16:
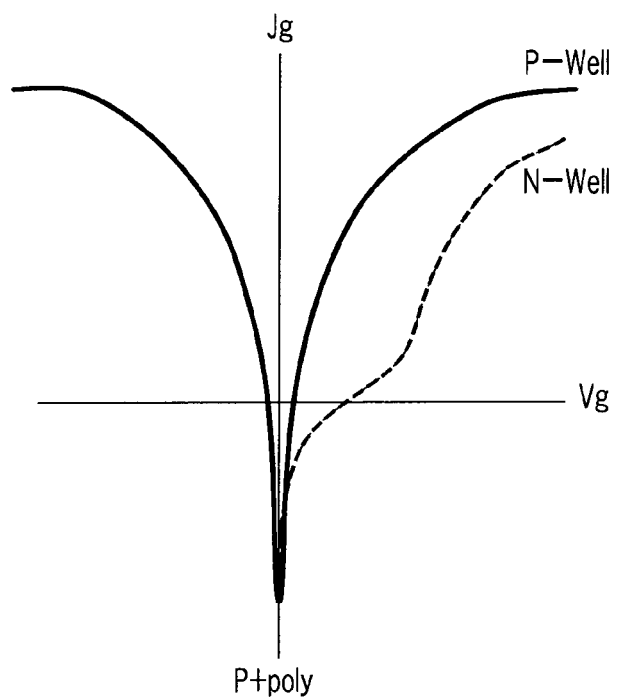
FIG. 16 is a graph showing a JV (leakage) characteristic of a MOS capacitor.

FIGS. 15 and 16 show JV characteristics of MOS capacitors each constituted by a well region, a floating gate, and an oxide layer formed therebetween.

In the example in FIG. 15, the floating gate consists of an N-type polysilicon (N+poly). In the example in FIG. 16, the floating gate consists of a P-type polysilicon (P+poly).

As is apparent from the drawings, when the conductivity type of the well region is different from the conductivity type of the impurity in the floating gate, a leakage current Jg generated is smaller than that generated when the conductivity types are equal to each other.

For example, when the gate potential Vg is negative, a leakage current generated when a MOS capacitor is constituted by a pair of a P-type well region (P-Well) and an N-type polysilicon (N+poly) is smaller than a leakage current generated when the MOS capacitor is constituted by a pair of an N-type well region (N-Well) and an N-type polysilicon (N+poly).

When the gate potential Vg is positive, a leakage current generated when a MOS capacitor is constituted by a pair of an N-type well region (N-Well) and a P-type polysilicon (P+poly) is smaller than a leakage current generated when the MOS capacitor is constituted by a pair of a P-type well region (P-Well) and a P-type polysilicon (P+poly).

The structures in FIGS. 6 and 7 will be exemplified below. That is, when the diffusion layers 22 and 22A are of N-types, the floating gate 13 of the aging device A1 is constituted by an N-type polysilicon layer, and the floating gates 13A of the control devices A2 and A3 are constituted by P-type polysilicon layers.

Similarly, when the diffusion layers 22 and 22A are of P-types, the floating gate 13 of the aging device A1 is constituted by a P-type polysilicon layer, and the floating gates 13A of the control devices A2 and A3 are constituted by N-type polysilicon layers.

In the structures in FIGS. 6 and 7, the conductivity type of the floating gate 13 of the aging device A1 and the conductivity type of the floating gates 13A of the control devices A2 and A3 are different from each other.

In this case, when the diffusion layer 22A immediately below the floating gates 13A of the control devices A2 and A3 may be omitted to obtain a structure shown in FIG. 9, or, as shown in FIG. 11, an FET, the conductivity types of the floating gates 13 and 13A can be made equal to each other.

In this case, when the semiconductor substrate and the diffusion layer 22 are of a P-type and an N-type, respectively, the floating gate 13 of the aging device A1 and the floating gates 13A of the control devices A2 and A3 are constituted by N-type polysilicon layers, respectively.

With this configuration, in writing, for example, positive potentials can be supplied to the control gate electrodes 15 and 15A, and electrons can be injected into the floating gates 13 and 13A. A state obtained after the electron injection is given by Vg<0 in FIG. 15.

When the semiconductor substrate and the diffusion layer 22 are of an N-type and a P-type, respectively, the floating gate 13 of the aging device A1 and the floating gates 13A of the control devices A2 and A3 are constituted by P-type polysilicon layers, respectively.

In this manner, in writing, for example, a negative potential can be supplied to the control gate electrodes 15 and 15A, and holes can be injected into the floating gates 13 and 13A. A state obtained after the hole injection is given by Vg>0 in FIG. 16.

As shown in FIG. 8, the diffusion layer 22 in FIG. 6 can also be omitted.

D. Type of Aging Device

The MIS type devices in FIGS. 3 to 7 are of enhancement types. In this case, an aging device is of a normally-on type in Table 1.

In order to realize the normally-off type aging device, the MIS type device must be of a depletion type. In this case, a leakage current may be in danger of being excessively large.

For example, in the depletion type structures in FIGS. 10 and 11, even though an impurity is doped in a channel region of the MIS type device (MISFET), a counter doping technique can decrease an impurity concentration of the channel region.

Figure 17:
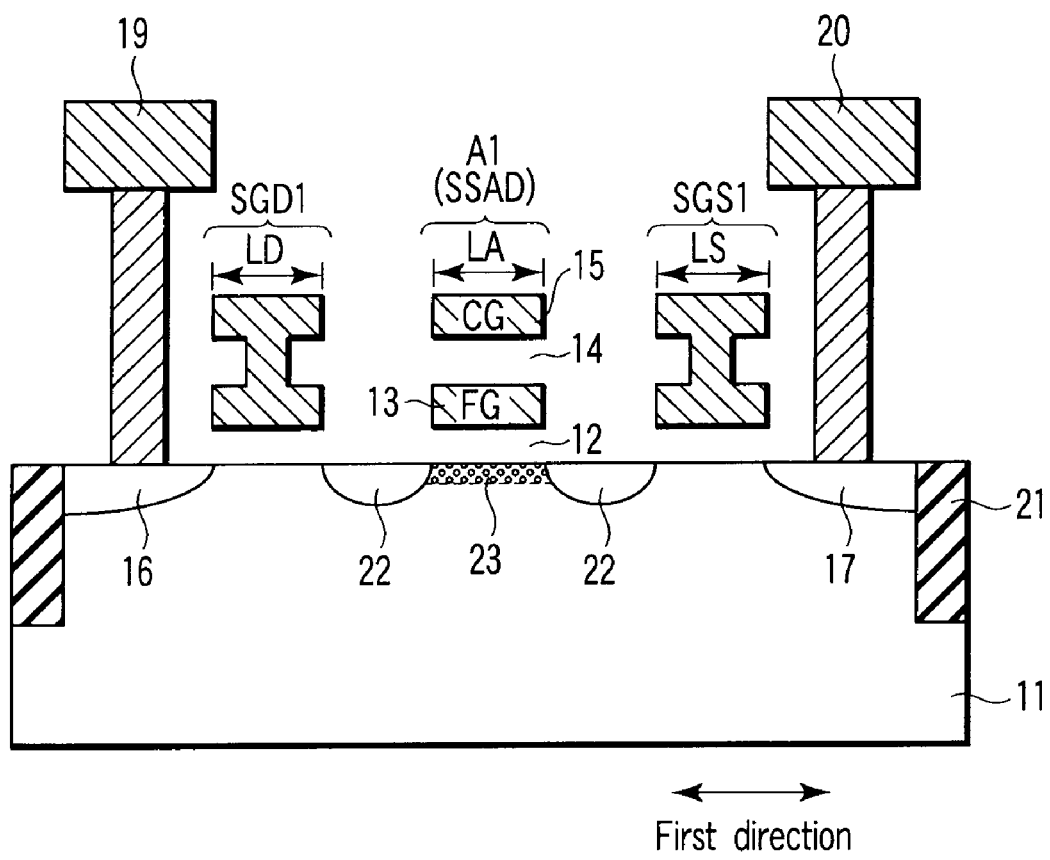
FIG. 17 is a sectional view showing an application of a counter doping technique.

More specifically, as shown in FIG. 17, an impurity is doped in the channel region of the aging device A1 (SSAD) to obtain a counter doping region 23.

In this case, a potential difference between an N-type well region (N-Well) and a P-type well region (P-Well) shown in FIGS. 15 and 16 becomes slightly small. However, the same effect as described above can be obtained.

In the other method, as shown in FIG. 18, the volumes of the floating gates 13A of the control devices A2 and A3 are made larger than the volume of the floating gate 13 of the aging device A1 as much as possible, so that a leakage current difference (difference in aging) can be sufficiently assured.

A structure in FIG. 18 is compatible with the counter doping technique. However, in terms of improvement of controllability of aging of the aging device, the structure need not be used together with the counter doping technique.

The structure in FIG. 18 can be easily obtained by applying a manufacturing technique for a flash memory.

For example, after first, second, and third conductive polysilicon layers (1st Poly/2nd Poly/3rd Poly) are stacked, the first, second, and third conductive polysilicon layers may be patterned.

The first and second conductive polysilicon layers on the first element region AA1 serve as the floating gate 13 and the control gate electrode 15, respectively. The first and second conductive polysilicon layers on the second and third element regions AA2 and AA3 are coupled to each other by a plug to serve as the floating gate 13A, and the third conductive polysilicon layer serves as the control gate electrode 15A.

The normally-off type aging device can be easily realized in the structures shown in FIGS. 10 and 11.

Figure 19:
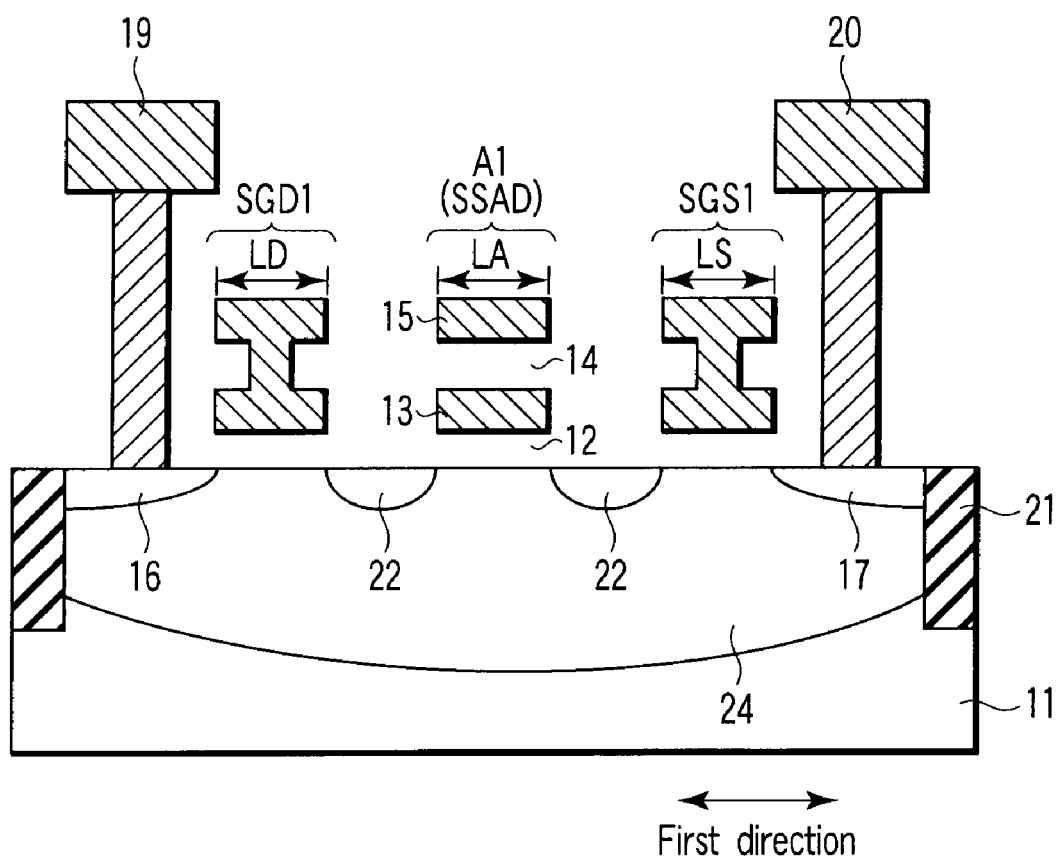
FIG. 19 is a sectional view showing a modification of the first embodiment.

FIG. 19 shows a structure of another case using the aging device A1 in FIG. 10 as a normally-off type aging device.

The semiconductor substrate 11 is of a P-type, a well region 24 is of an N-type, and the diffusion layers 16, 17, and 22 are of P-types. The floating gate 13 and the control gate electrode 15 are constituted by N-type conductive polysilicon layers.

In this case, for example, a ground potential is applied to a channel region, and a positive write potential is applied to the control gate electrode 15. At this time, electrons are injected from the channel region into the floating gate 13 by FN tunneling.

When the electrons are injected into the floating gate 13, the channel region of the MIS type device (MISFET) A1 is inverted from an N-type to a P-type. For this reason, the MIS type device A1 is in an on state.

The electrons in the floating gate 13 are discharged with elapse of time. At a certain point of time, the channel region of the MIS type device A1 returns from the P-type to the N-type, and the MIS type device A1 is turned off.

The point of time at which the MIS type device A1 is turned off corresponds to the end of the aging.

In this manner, the normally-off type aging device can be realized by using the structure in FIG. 19.

In the structure in FIG. 19, the semiconductor substrate 11 is of an N-type, the well region 24 is of a P-type, the diffusion layers 16, 17, and 22 are of N-types, and the floating gate 13 and the control gate electrode 15 are constituted by P-type conductive polysilicon layers. Even in this case, the normally-off type aging device can be realized.

In this case, writing (initial setting), for example, is performed by applying a ground potential to the channel region, applying a negative write potential to the control gate electrode 15, and injecting holes into the floating gate 13.

When the holes are injected into the floating gate 13, the channel region of the MIS type device (MISFET) A1 is inverted from the P-type to the N-type. For this reason, the MIS type device A1 is in an on state.

The holes in the floating gate 13 are discharged with elapse of time. At a certain point of time, the channel region of the aging device A1 returns from the N-type to the P-type, and the aging device A1 is turned off.

Since the normally-on aging device and the normally-off aging device can be realized as described above, the four functions shown in Table 1 can be realized by combining these two types of aging devices.

E. Other

Verify reading will be described below with reference to the normally-on aging devices in FIGS. 6 and 7.

The semiconductor substrate 11 is of an N-type, the diffusion layers 16, 17, and 22 are of P-types, and the floating gate 13 and the control gate electrode 15 are constituted by P-type conductive polysilicon layers.

When no write potential or potential smaller than the write potential is applied to the control gate electrode 15, negative potentials are applied to the gate electrodes of the select gate transistors SGD1 and SGS1 to set the select gate transistors SGD1 and SGS1 in on states. At this time, a current (drain current) flowing between the drain diffusion layer 16 and the source diffusion layer 17 is dependent of the state (the number of electric charges in the floating gate 13) of the aging device. For this reason, the current is detected by a sense amplifier.

When the write pulses are applied to the control gate electrode 15, for example, the channel region must have a ground potential. For this reason, at least one of the select gate transistors SGD1 and SGS1 is turned on, and the ground potential is transferred to the channel region.

Furthermore, the verifying may be repeatedly performed to adjust the aging after writing in the control device and the verifying is completed.

When the number of electric charges injected into the floating gate of in the control device is large, the life time of the aging device becomes short. For this reason, even though the thicknesses of the tunnel insulating films of the control device and the aging device are equal to each other, the aging (life time) of the aging device can be controlled.

With respect to manufacturing fluctuation of leakage characteristics of the aging device, the leakage characteristics are inspected before shipping. According to the result, conditions for a method of writing (injection of electric charges) in the control device can be controlled.

When this method is employed, even in aging devices manufactured on the same production line, the number of electric charges injected into the floating gate of the control device is adjusted to make it possible to provide a plurality of aging devices having different agings.

Therefore, a user, depending on the object, can set the aging of an aging device by using the above conditions, and an aging error generated by manufacturing fluctuation can be suppressed.

An end user who has purchased an aging device-mounted product can use the product only during a predetermined period set by a product supplier without knowing the circumstances. More specifically, even if the end user connects the product to a network or disconnects the product from an external power supply, the user cannot use the product beyond the expiration date.

(2) Second Embodiment

A. Structure

Figure 20:
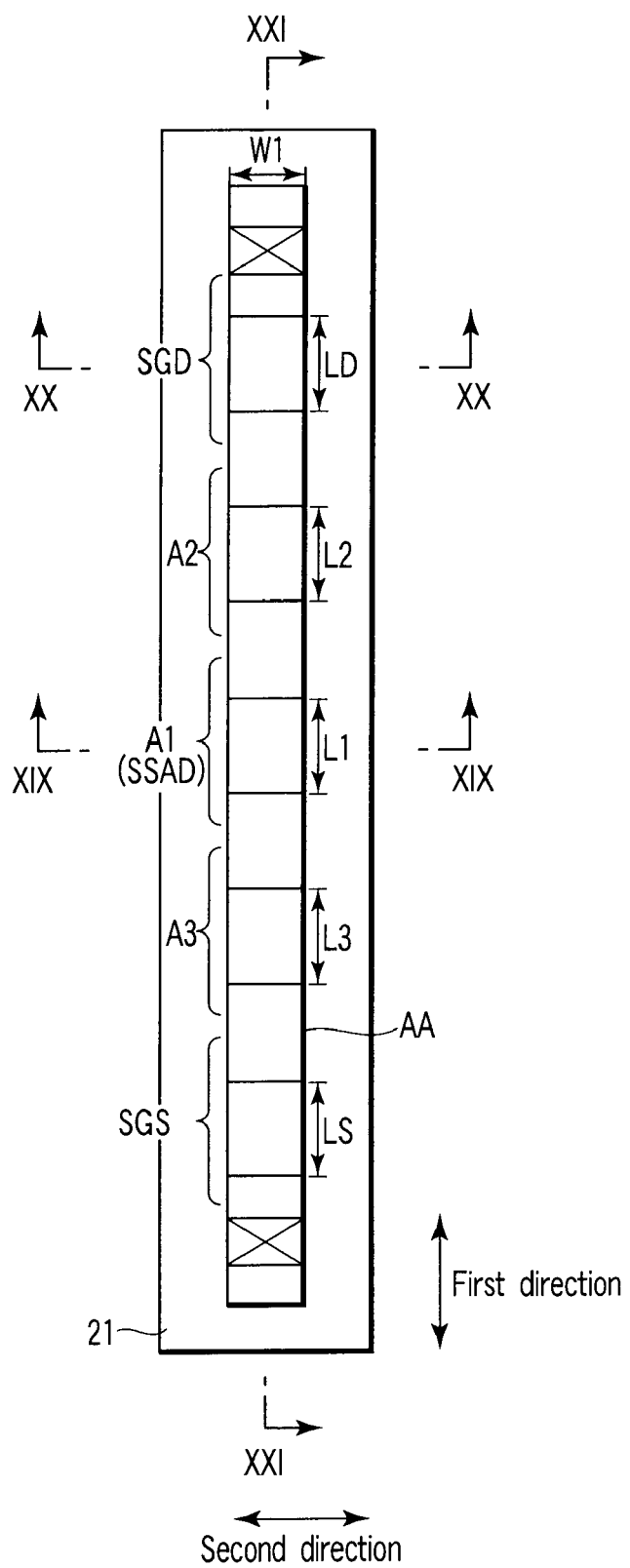
FIG. 20 is a plan view showing a semiconductor integrated circuit according to a second embodiment.

FIG. 20 is a plan view of a semiconductor integrated circuit according to a second embodiment.

FIG. 21 is a sectional view along the XIX-XIX line in FIG. 20, FIG. 22 is a sectional view along the XX-XX line in FIG. 20, and FIG. 23 is a sectional view along the XXI-XXI line in FIG. 20.

In the first embodiment, an array of the control device, the aging device, and the control device arranged in the order named is formed through the element isolation insulating layer. However, in the second embodiment, an array of a control device, an aging device, and a control device arranged in the order named is formed in one element region.

In the semiconductor substrate 11, an element isolation insulating layer 21 having an STI structure is formed. An element region (active area) AA is surrounded by the element isolation insulating layer 21. The width of the element region (active area) AA in the second direction is set as W1.

In the element region AA, a first MIS type device A1 (SSAD) functioning as an aging device, and second and third MIS type devices A2 and A3 serving as control devices sandwiching the first MIS type device A1 are arranged. In the element region AA, two select gate transistors SGD and SGS which sandwich the first, second, and third MIS type devices A1, A2, and A3 are arranged.

The first, second, and third MIS type devices A1, A2, and A3 and the two select gate transistors SGD and SGS are connected in series with each other.

The first MIS type device A1 has a stack gate structure. More specifically, a floating gate 13 is formed on the semiconductor substrate 11 through a tunnel insulating film 12, and a control gate electrode 15 is formed on the floating gate 13 through an inter-electrode insulating layer 14.

The length of the floating gate 13 in the first direction is set as L1, and the width thereof in the second direction is set as W1.

The second and third MIS type devices A2 and A3, like the first MIS type device A1, have stack gate structures. More specifically, as shown in FIG. 23, a floating gate 13A is formed on the semiconductor substrate 11 through a tunnel insulating film 12A, and a control gate electrode 15A is formed on the floating gate 13A through an inter-electrode insulating layer 14A.

The tunnel insulating film 12A and the inter-electrode insulating layer 14A are desirably in common with the tunnel insulating film 12 and the inter-electrode insulating layer 14.

The length of the floating gate 13A in the first direction is set as L2 or L3, and the width thereof in the second direction is set as W1.

A diffusion layer 22 is formed in the semiconductor substrate 11 immediately below the first, second, and third MIS type devices A1, A2, and A3.

A drain diffusion layer 16 of the select gate transistor SGD is connected to a drain electrode 19 through a contact plug. A source diffusion layer 17 of the select gate transistor SGS is connected to a source electrode 20 through a contact plug.

The select gate transistors SGD and SGS, as in the first, second, and third MIS type devices A1, A2, and A3, have stack gate structures. However, an upper gate electrode and a lower gate electrode are connected to each other by a conductive plug.

In such a semiconductor integrated circuit, the control gate electrodes 15 and 15A of the first, second, and third MIS type devices A1, A2, and A3 are independently controlled.

The diffusion layer 22 and the floating gate 13 are set to be of the same conductivity type, and the diffusion layer 22 and the floating gate 13A are set to be of different conductive types. In this embodiment, the semiconductor substrate is of a P-type, and the diffusion layers 16, 17, and 22 are of N-types. For this reason, the floating gate 13 is constituted by an $N^+$-type polysilicon layer, and the floating gate 13A is constituted by a $P^+$-type polysilicon layer.

Furthermore, when capacitive coupling Cfg occurring between the floating gates 13 and 13A is sufficiently large, the aging of the aging device A1 can be controlled by using the number of electric charges injected into the control devices A2 and A3.

The semiconductor integrated circuit as described above, as in the first embodiment, can be easily formed by using manufacturing processes for a flash memory. Since the control gate electrodes 15 and 15A of the first, second, and third MIS type devices A1, A2, and A3 must be isolated from each other, mask patterns must be different from those of flash memory.

B. Operation

One of the characteristic features of the second embodiment is that the conductivity type of the floating gate of the first MIS type device A1 serving as an aging device and the conductivity types of the floating gates of the MIS type devices A2 and A3 serving as control devices are different from each other.

Structures in FIGS. 20 to 23 will be exemplified. A writing operation (initial setting) in the control device is performed first. Thereafter, a writing operation in the aging device is preferably performed. This order is to avoid both the writing operations from being simultaneously performed. As long as the writing operations are not simultaneously performed, the order may be reversed.

In the writing operations, as described in the first embodiment, the verify technique (FIGS. 12 to 14) is employed to accurately control the aging of the aging device.

In the second embodiment, the following phenomenon may occur. That is, while writing is performed in one of the aging device and the control device, writing is feebly performed in the other.

Figure 24:
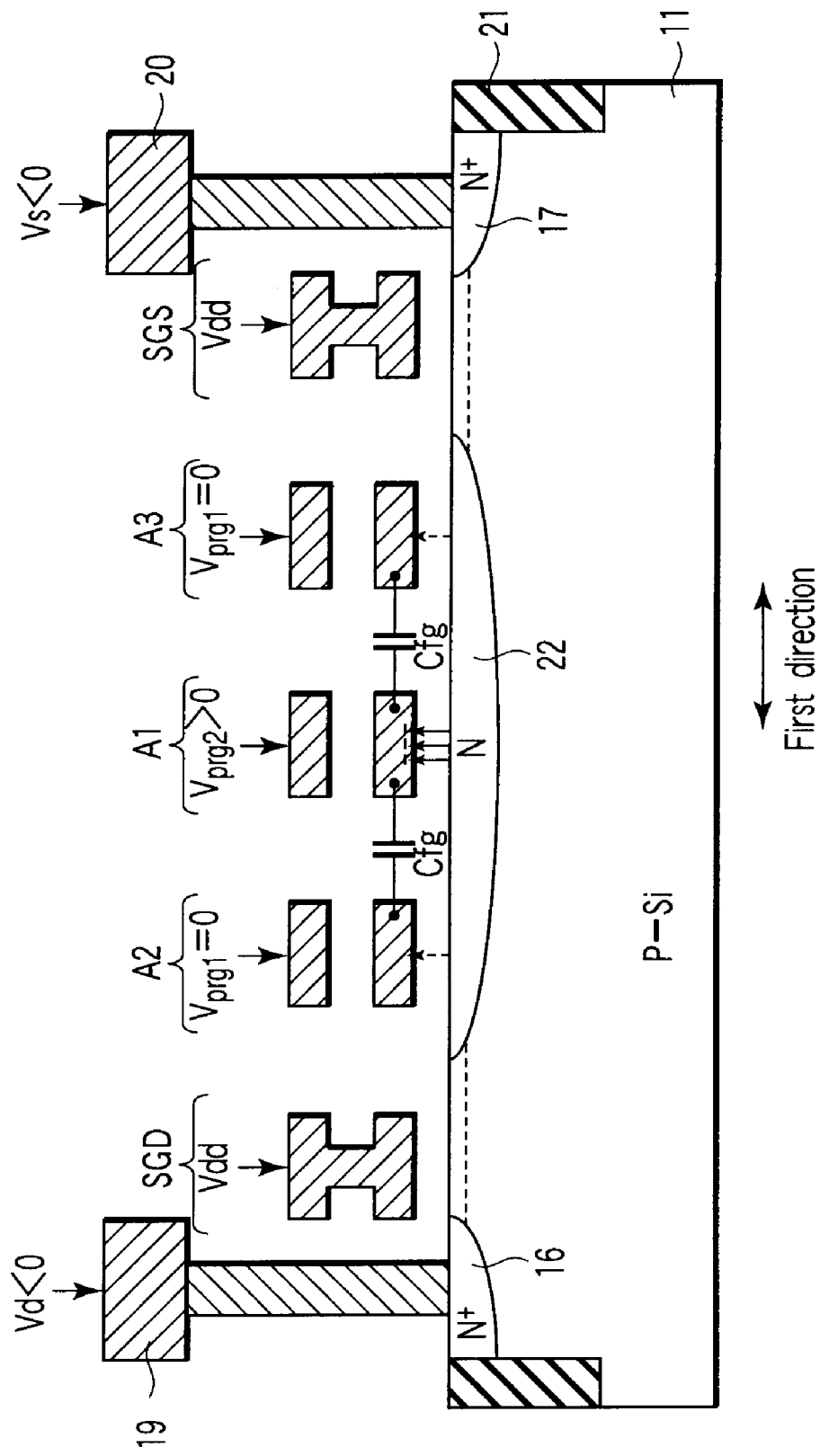
FIG. 24 is a sectional view showing a manner in a write state.

FIG. 24 shows an example of the phenomenon.

The example shows a manner of writing in the first MIS type device A1 serving as the aging device.

A writing potential Vprg2 (>0) is applied to the control gate electrode of the first MIS type device A1, ground potential Vss (=0 V) is applied to the control gates of the second and third MIS type devices A2 and A3, and a power supply potential Vdd is applied to the gate electrodes of the select gate transistors SGD and SGS.

Potentials Vd and Vs less than 0 V are applied to the drain electrode 19 and the source electrode 20, respectively.

At this time, since the select gate transistors SGD and SGS are turned on, the potentials Vd and Vs less than 0 V are transferred to the diffusion layer 22. In this case, a high electric field is applied to the tunnel insulating film of the first MIS type device A1, and electrons are injected from the diffusion layer 22 into the floating gate of the first MIS type device A1 by FN tunneling.

At the same time, also on the second and third MIS type devices A2 and A3, electrons are feebly injected into the floating gates.

After the writing operation in the first MIS type device A1, write-back operations in the second and third MIS type devices A2 and A3 are performed.

FIG. 25 shows an example of the write-back operation.

While a write potential Vprg2 (>0) is applied to the control gate electrode of the first MIS type device A1, the potentials of the control gate electrodes of the second and third MIS type devices A2 and A3 are changed from ground potentials Vss (=0 V) to Vprg1 (<0). Potentials Vd and Vs higher than 0 V are applied to the drain electrode 19 and the source electrode 20, respectively.

The magnitudes of the potentials Vprg1, Vd, and Vs are optimally set depending on the degree of write-back.

The gate electrodes of the select gate transistors SGD and SGS are kept at the power supply voltage Vdd.

At this time, since the select gate transistors SGD and SGS are turned on, the potentials Vd and Vs higher than 0 V are transferred to the diffusion layer 22. In this case, a high electric field is applied to the tunnel insulating films of the second and third MIS type devices A2 and A3, and electrons are emitted from the floating gates of the second and third MIS type devices A2 and A3 into the diffusion layer 22 by FN tunneling.

In the structures in FIGS. 20 to 23, even if the conductivity types of the respective parts are reversed, the same effect as described above can be obtained.

Figure 26:
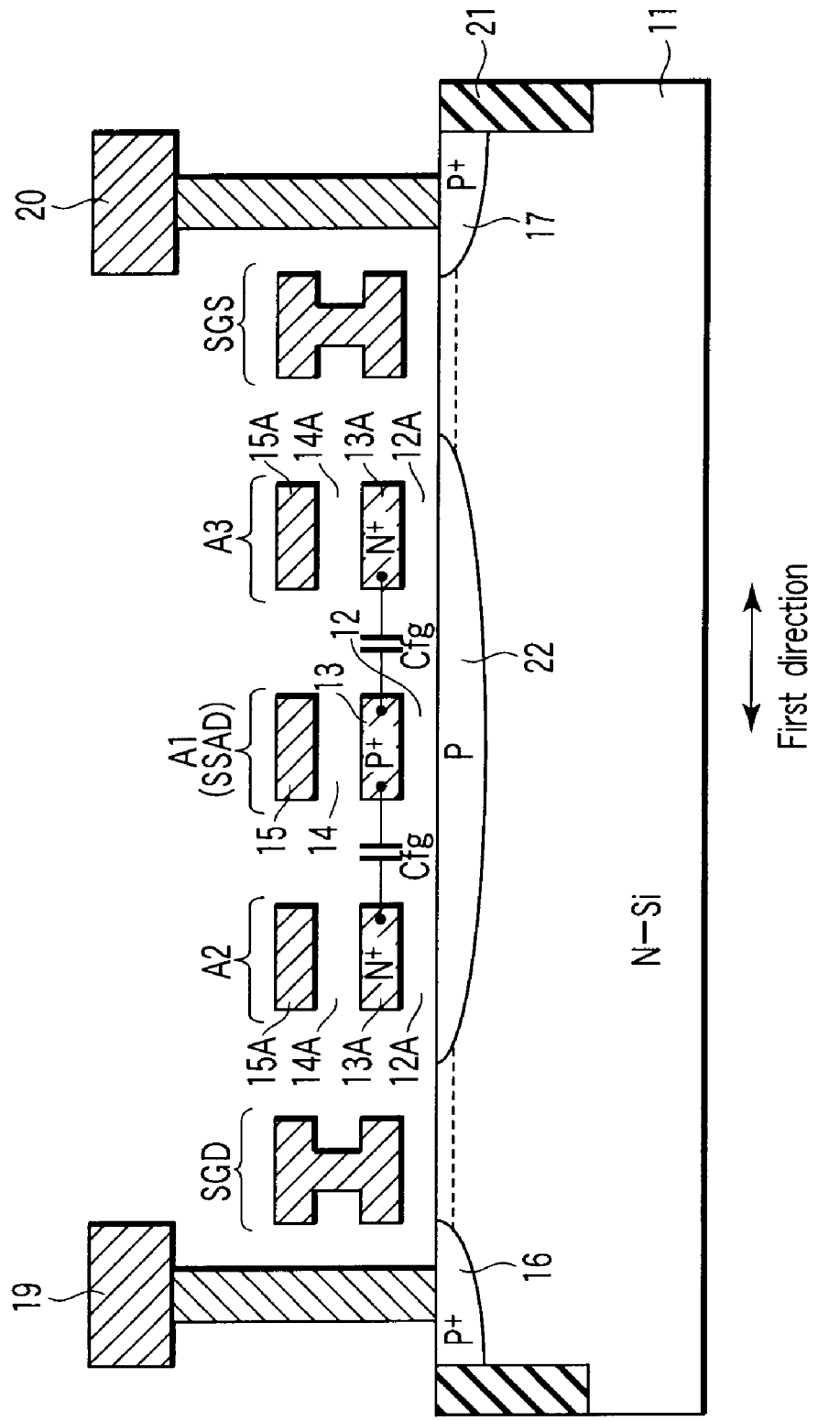
FIG. 26 is a sectional view showing a modification of the second embodiment.

FIG. 26 shows an example of the structures.

A semiconductor substrate is of an N-type, the diffusion layers 16, 17, and 22 are of P-types, the floating gate 13 is constituted by a $P^+$-type polysilicon layer, and the floating gate 13A is constituted by an $N^+$-type polysilicon layer.

The aging of the first MIS type device A1 serving as an aging device can be adjusted by the numbers of electric charges injected into the floating gates 13A of the MIS type devices A2 and A3 serving as control devices when the capacitive coupling Cfg occurring between the floating gates 13 and 13A is sufficiently large.

C. Controllability of Aging

Even in the second embodiment, the aging (life time) of the control device is sufficiently longer than the aging (life time) of the aging device, and the controllability of the aging of the aging device achieved by the control device is improved.

Figure 27:
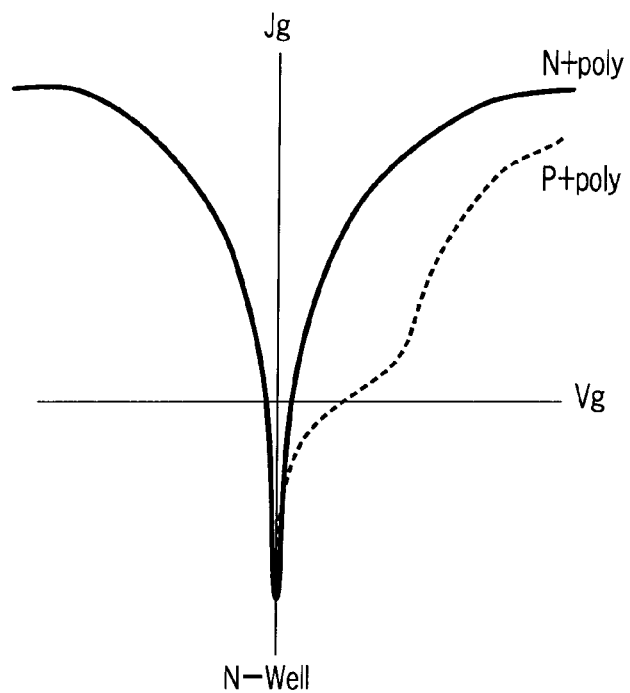
FIG. 27 is a diagram showing a JV (leakage) characteristic of a MOS capacitor.
Figure 28:
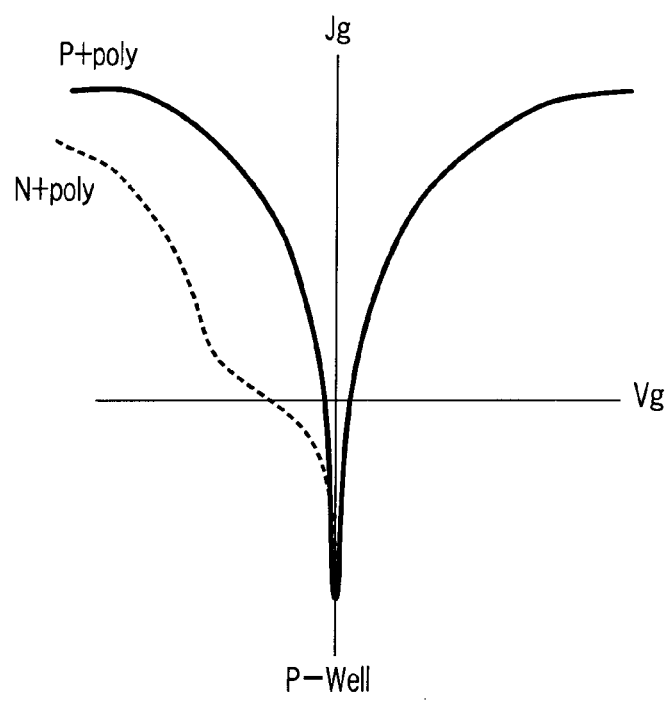
FIG. 28 is a diagram showing a JV (leakage) characteristic of a MOS capacitor.

FIGS. 27 and 28 show JV characteristics of MOS capacitors each constituted by a well region, a floating gate, and an oxide layer formed therebetween.

In the example in FIG. 27, as shown in FIG. 23, the diffusion layer 22 is of an N-type (N-Well). In this case, a leakage current obtained when the floating gate consists of a P-type polysilicon (P+poly) is lower than that obtained when the floating gate consists of an N-type polysilicon (N+poly).

In the example in FIG. 28, as shown in FIG. 26, the diffusion layer 22 is of a P-type (P-Well). In this case, a leakage current obtained when the floating gate consists of an N-type polysilicon (N+poly) is lower than that obtained when the floating gate consists of a P-type polysilicon (P+poly).

In short, in any case, since the agings of the second and third MIS type devices A2 and A3 serving as control devices are longer than the aging of the first MIS type device A1 serving as an aging device, the controllability of the aging of the aging device is improved.

(4) Third Embodiment

A third embodiment is a modification of the first embodiment.

In order to improve the performance of an aging device, interference between the aging device and the control device is preferably increased, and interference between the aging device and the select gate transistor is preferably decreased.

Figure 29:
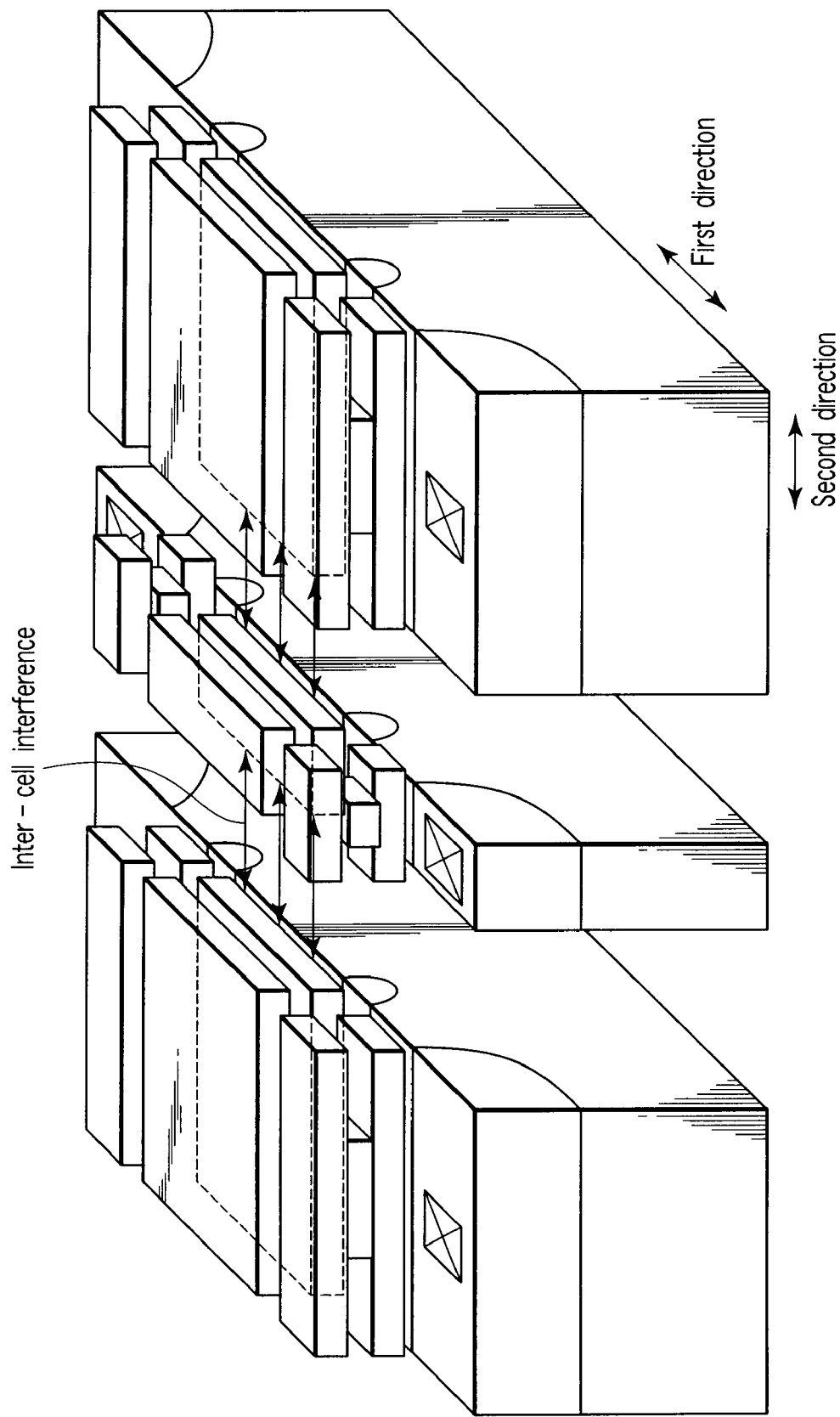
FIG. 29 is a perspective view showing the semiconductor integrated circuit according to the first embodiment.

In the first embodiment, as one of means for this purpose, as shown in FIG. 29, the width of the floating gate of the first MIS type device A1 serving as the aging device in a first direction is larger than the width thereof in the second direction.

In contrast to this, in the third embodiment, dents on both the sides of a floating gate of an aging device in a first direction are provided to increase the interference between the aging device and the control device and to decrease the interference between the aging device and the select gate transistor.

A. Structure

Figure 30:
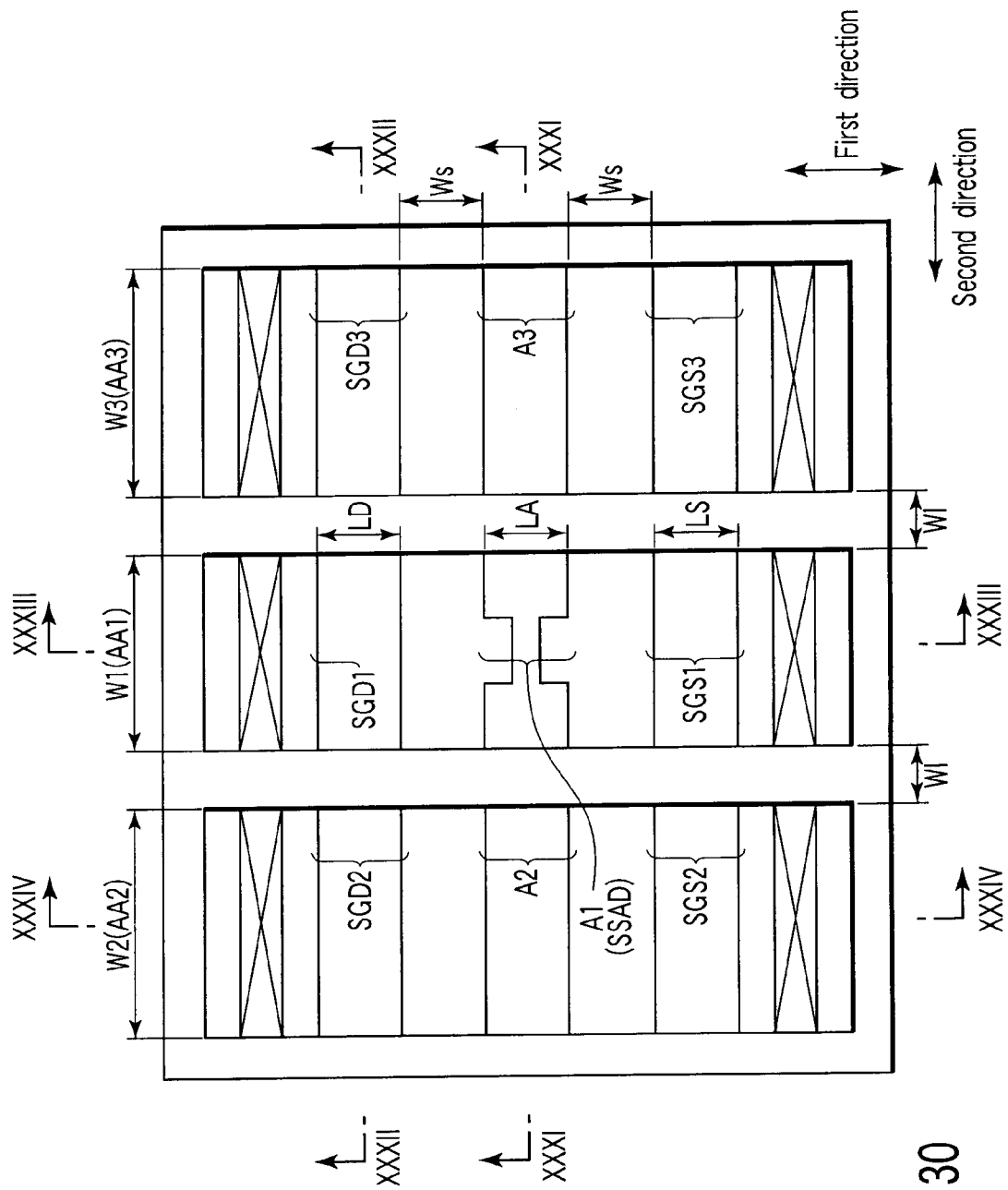
FIG. 30 is a plan view showing a semiconductor integrated circuit according to a third embodiment.

FIG. 30 shows a plan view of a semiconductor integrated circuit according to the third embodiment.

FIG. 31 is a sectional view along the XXXI-XXXI line in FIG. 30, FIG. 32 is a sectional view along the XXXII-XXXII line in FIG. 30, FIG. 33 is a sectional view along the XXXIII-XXXIII line in FIG. 30, and FIG. 34 is a sectional view along the XXXIV-XXXIV line in FIG. 30.

In a semiconductor substrate 11, an element isolation insulating layer 21 having an STI structure is formed. First, second, third element regions (active areas) AA1, AA2, and AA3 are isolated from each other by the element isolation insulating layer 21 and adjacently arranged in a second direction orthogonal to a first direction.

A width W1 of the first element region AA1 in a second direction is smaller than widths W2 and W3 of the second and third element regions AA2 and AA3 in the second direction.

In the first element region AA1, a first MIS type device (SSAD) A1 functioning as an aging device and two select gate transistors SGD1 and SGS1 sandwiching the first MIS type device A1 are arranged. The first MIS type device A1 and the two select gate transistors SGD1 and SGS1 are connected in series with each other.

The first MIS type device A1 has a stack gate structure. More specifically, on the semiconductor substrate 11, a floating gate (FG) 13 is formed through a tunnel insulating film 12, and a control gate electrode (CG) 15 is formed on the floating gate 13 through an inter-electrode insulating layer 14.

The width W1 of the floating gate 13 in the second direction is larger than a length LA of the floating gate 13 in the first direction. A width W1 of the floating gate 13 in the second direction is equal to a width of the first element region AA1. Furthermore, dents are formed on both the sides of the floating gate 13 in the first direction.

In the semiconductor substrate 11 immediately below the first MIS type device A1, a diffusion layer 22 is formed.

A drain diffusion layer 16 of the select gate transistor SGD1 is connected to a drain electrode 19 through a contact plug. A source diffusion layer 17 of the select gate transistor SGS1 is connected to a source electrode 20 through a contact plug.

The widths W1 of the gate electrodes of the select gate transistors SGD1 and SGS1 in the second direction are larger than lengths LD and LS of the gate electrodes of the select gate transistors SGD1 and SGS1 in the first direction.

In the second element region AA2, a second MIS type device A2 functioning as a control device and two select gate transistors SGD2 and SGS2 sandwiching the second MIS type device A2 are arranged. The second MIS type device A2 and the two select gate transistors SGD2 and SGS2 are connected in series with each other.

The second MIS type device A2, like the first MIS type device A1, has a stack gate structure. More specifically, on the semiconductor substrate 11, a floating gate (FG) 13A is formed through a tunnel insulating film 12A. On the floating gate 13A, a control gate electrode (CG) 15A is formed through an inter-electrode insulating layer 14A.

A width W2 of the floating gate 13A in the second direction is larger than a length LA of the floating gate 13A in the first direction. A width W2 of the floating gate 13A in the second direction is equal to the width of the second element region AA2.

In the semiconductor substrate 11 immediately below the second MIS type device A2, a diffusion layer 22A is formed.

A drain diffusion layer 16A of the select gate transistor SGD2 is connected to a drain electrode 19A through a contact plug. A source diffusion layer 17A of the select gate transistor SGS2 is connected to a source electrode 20A through a contact plug.

In the third element region AA3, a third MIS type device A3 functioning as a control device and two select gate transistors SGD3 and SGS3 sandwiching the third MIS type device A3 are arranged. The third MIS type device A3 and the two select gate transistors SGD3 and SGS3 are connected in series with each other.

The structure of the third MIS type device A3 is the same as that of the second MIS type device A2, and the structures of the two select gate transistors SGD3 and SGS3 sandwiching the third MIS type device A3 are the same as those of the select gate transistors SGD2 and SGS2 sandwiching the second MIS type device A2, so that descriptions of the structures will be omitted.

In the semiconductor integrated circuit, the control gate electrodes (CG) 15 and 15A of the first, second, and third MIS type devices A1, A2, and A3 are independently controlled.

A width WI of the element isolation insulating layer 21 between the first and second element regions AA1 and AA2 in the second direction is smaller than widths Ws in the first direction between one gate electrode of the select gate transistors SGD1, SGS1, SGD2, and SGS2 and the floating gates (FG) 13 and 13A of the first and second MIS type devices A1 and A2.

Similarly, the width WI of the element isolation insulating layer 21 between the first and third element regions AA1 and AA3 in the second direction is smaller than the widths Ws in the first direction between one gate electrode of the select gate transistors SGD1, SGS1, SGD3, and SGS3 and the floating gates (FG) 13 and 13A of the first and third MIS type devices A1 and A3.

Lengths LA of the floating gates (FG) 13 and 13A of the first, second, and third MIS type devices A1, A2, and A3 in the first direction are laid out to be equal to each other, and lengths LD and LS of the gate electrodes of the select gate transistors SGD1, SGS1, SGD2, SGS2, SGD3, and SGS3 in the first direction are laid out to be equal to each other.

The select gate transistors SGD1, SGS1, SGD2, SGS2, SGD3, and SGS3, like the first, second, and third MIS type devices A1, A2, and A3, have stack gate structures. However, upper gate electrodes and lower gate electrodes are connected to each other by conductive plugs.

The semiconductor integrated circuit as described above can be easily formed by using manufacturing processes for a flash memory. Since the control gate electrodes 15 and 15A of the first, second, and third MIS type devices A1, A2, and A3 must be isolated from each other, mask patterns must be different from those of flash memory.

In the semiconductor integrated circuits in FIGS. 33 and 34, the first, second, and third MIS type devices A1, A2, and A3 do not constitute a MISFET. However, for example, as shown in FIGS. 37 and 38, the first, second, and third MIS type devices A1, A2, and A3 may constitute a MISFET.

Figure 35:
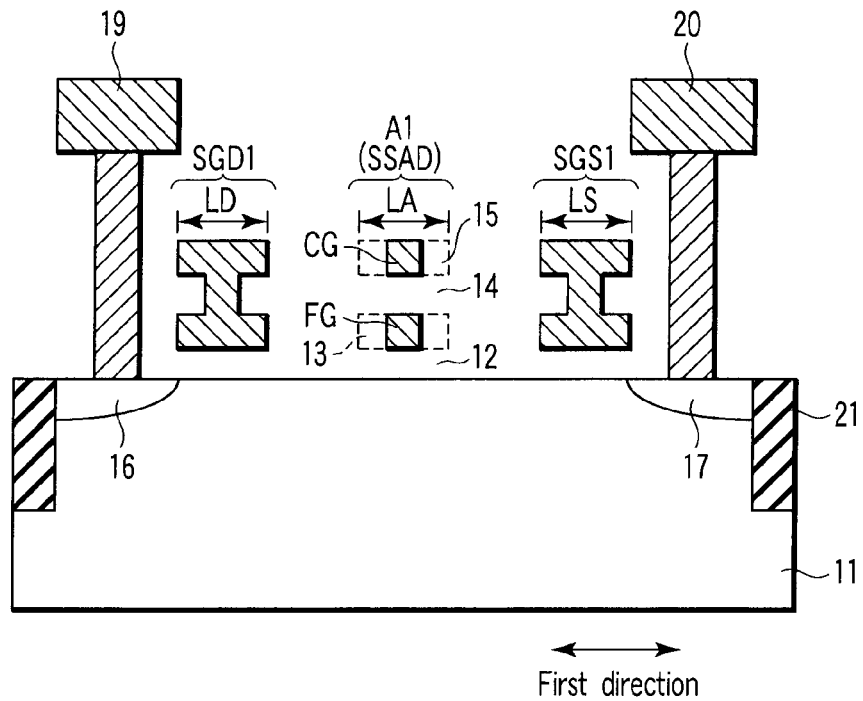
FIG. 35 is a sectional view along the XXXIII-XXXIII line in FIG. 30.
Figure 36:
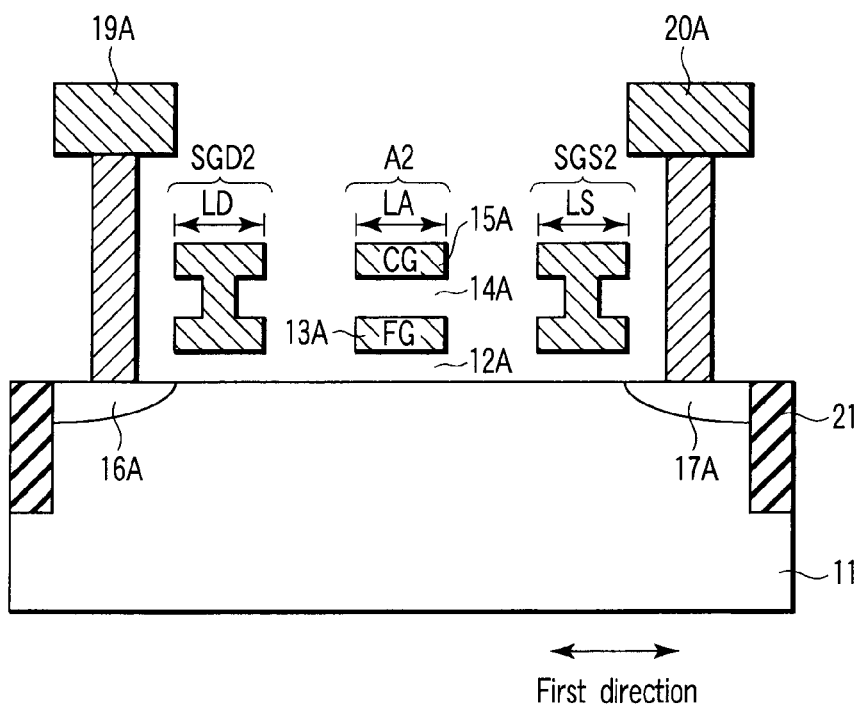
FIG. 36 is a sectional view along the XXXIV-XXXIV line in FIG. 30.

FIGS. 35 and 36 are obtained by removing the diffusion layers 22 and 22A from FIGS. 37 and 38. Even in the configurations, predetermined functions of an aging device can be realized.

FIGS. 37 and 38 are sectional views in the first direction corresponding to FIGS. 33 and 34. Since the sectional views in the second direction are the same as FIGS. 31 and 32, respectively, a description thereof will be omitted.

B. Operation

In each of the semiconductor integrated circuits in FIGS. 30 to 34, an aging of the first MIS type device (aging device) A1 is controlled by using the MIS type devices A2 and A3 serving as control devices. In this control, the capacitive coupling Cfg between the floating gates 13 and 13A is used.

Since the operation is the same as that in the first embodiment, a description thereof will be omitted.

C. Controllability of Aging

In order to improve controllability of an aging (life time) of an aging device, an aging (life time) of a control device must be longer than the aging of the aging device.

Since the controllability of the aging is the same as that in the first embodiment, a description thereof will be omitted.

E. Conclusion

According to the third embodiment, when the shape of the floating gate of the first MIS type transistor serving as an aging device is devised, even if the width of the floating gate of the first MIS type transistor in the first direction is not made larger than the width in the second direction unlike in the first embodiment, the same effect as that in the first embodiment can be obtained.

(5) Fourth Embodiment

A fourth embodiment is a modification of the third embodiment.

The fourth embodiment is different from the third embodiment in widths of first element regions.

Figure 39:
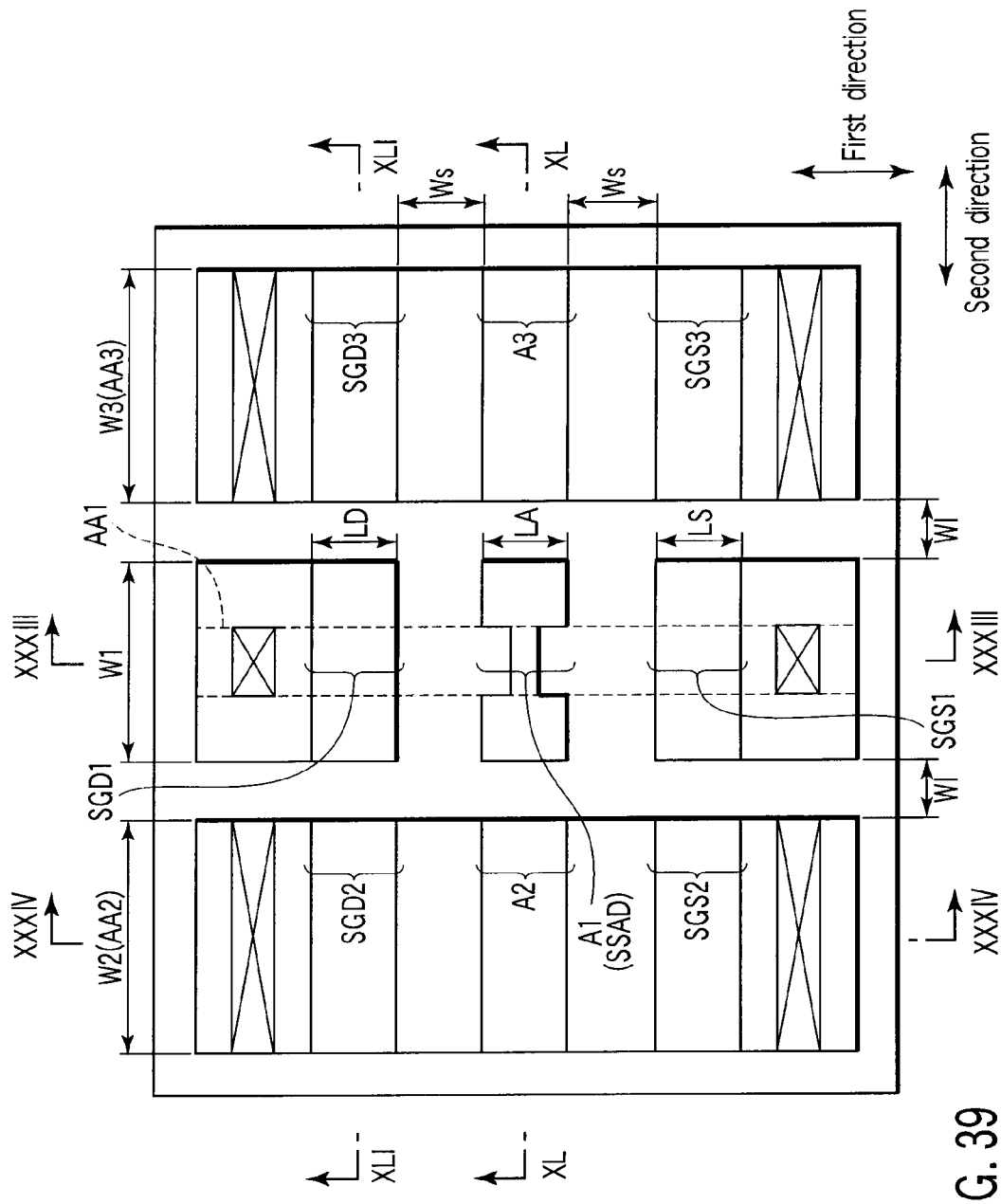
FIG. 39 is a plan view showing a semiconductor integrated circuit according to a fourth embodiment.

FIG. 39 is a plan view of a semiconductor integrated circuit according to the fourth embodiment.

Figure 40:
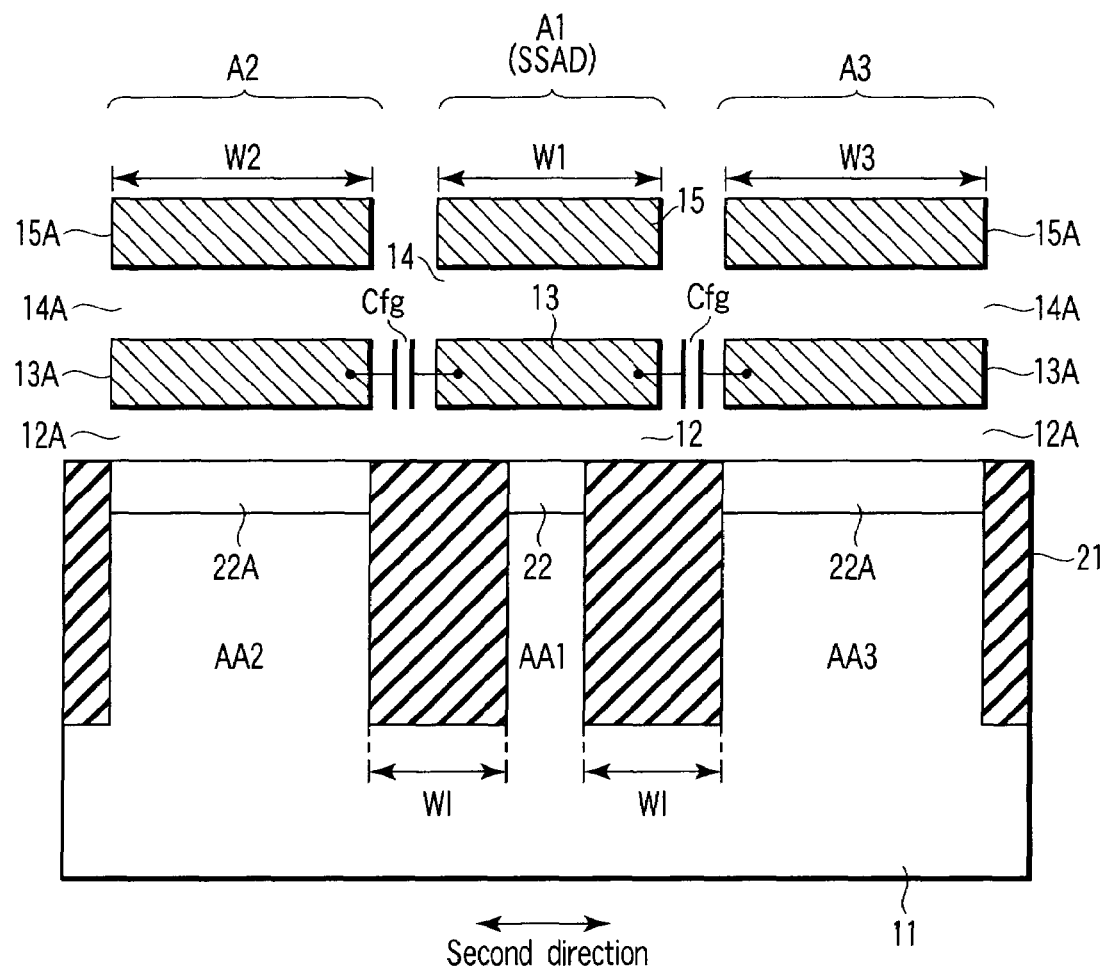
FIG. 40 is a sectional view along the XL-XL line in FIG. 39.
Figure 41:
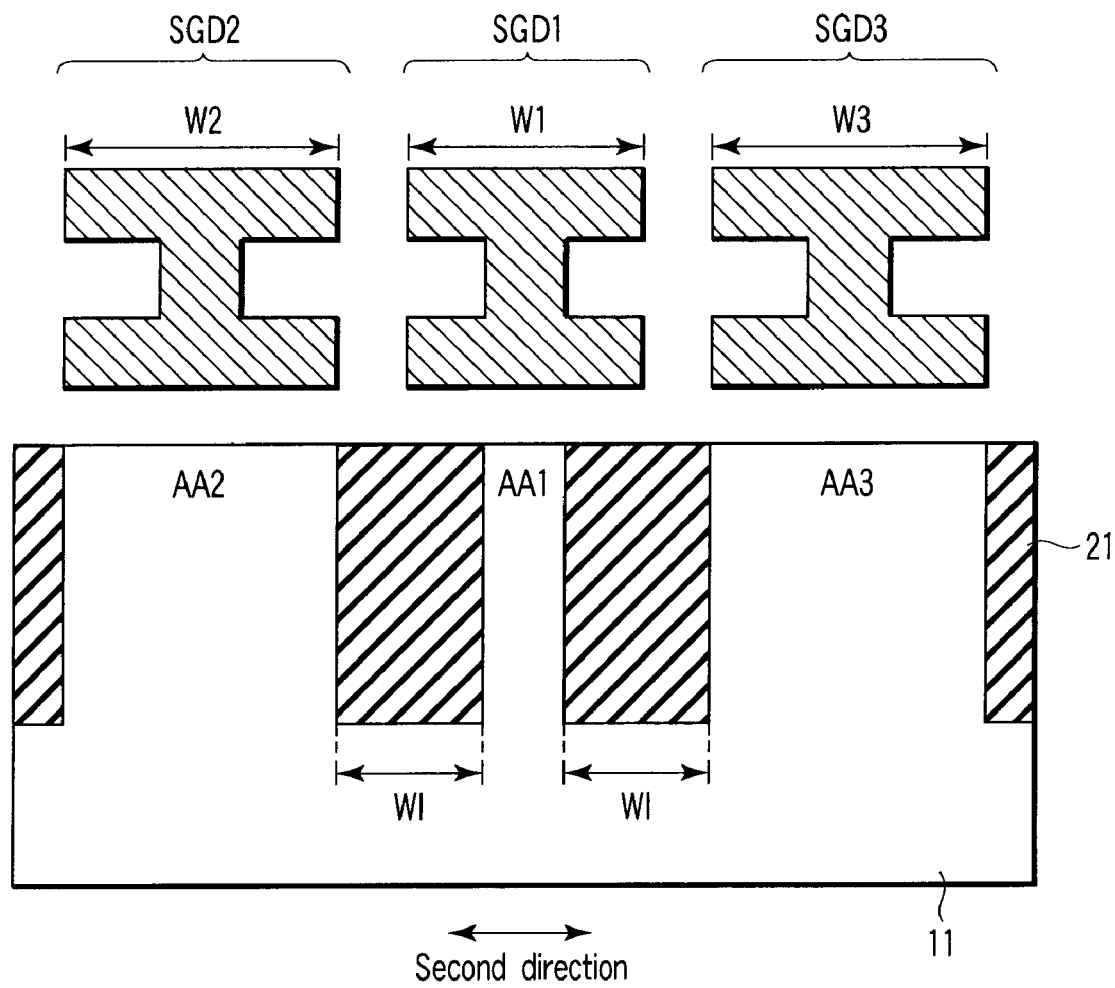
FIG. 41 is a sectional view along the XLI-XLI line in FIG. 39.

FIG. 40 is a sectional view along the XL-XL line in FIG. 39, and FIG. 41 is a sectional view along the XLI-XLI line in FIG. 39.

A sectional view along the XXXIII-XXXIII line in FIG. 39 is as shown in FIG. 33, and a sectional view along the XXXIV-XXXIV line in FIG. 39 is as shown in FIG. 34.

In a semiconductor substrate 11, an element isolation insulating layer 21 having an STI structure is formed. First, second, and third element regions (active areas) AA1, AA2, and AA3 are isolated from each other by the element isolation insulating layer 21, and adjacently arranged in a second direction orthogonal to a first direction.

A width W1 in a second direction is smaller than widths W2 and W3 of the second and third element regions AA2 and AA3 in the second direction.

In the first element region AA1, a first MIS type device (SSAD) A1 functioning as an aging device and two select gate transistors SGD1 and SGS1 sandwiching the first MIS type device A1 are arranged. The first MIS type device A1 and the two select gate transistors SGD1 and SGS1 are connected in series with each other.

The first MIS type device A1 has a stack gate structure. More specifically, on the semiconductor substrate 11, a floating gate (FG) 13 is formed through a tunnel insulating film 12, and a control gate electrode (CG) 15 is formed on the floating gate 13 through an inter-electrode insulating layer 14.

The width W1 of the floating gate 13 in the second direction is larger than a width of the first element region AA1. Furthermore, dents are formed on both the sides of the floating gate 13 in the first direction.

In the semiconductor substrate 11 immediately below the first MIS type device A1, a diffusion layer 22 is formed.

A drain diffusion layer 16 of the select gate transistor SGD1 is connected to a drain electrode 19 through a contact plug. A source diffusion layer 17 of the select gate transistor SGS1 is connected to a source electrode 20 through a contact plug.

The widths W1 of the gate electrodes of the select gate transistors SGD1 and SGS1 in the second direction are larger than the width of the first element region AA1.

In the second element region AA2, a second MIS type device A2 functioning as a control device and two select gate transistors SGD2 and SGS2 sandwiching the second MIS type device A2 are arranged. The second MIS type device A2 and the two select gate transistors SGD2 and SGS2 are connected in series with each other.

The second MIS type device A2, like the first MIS type device A1, has a stack gate structure. More specifically, on the semiconductor substrate 11, a floating gate (FG) 13A is formed through a tunnel insulating film 12A. On the floating gate 13A, a control gate electrode (CG) 15A is formed through an inter-electrode insulating layer 14A.

A width W2 of the floating gate 13A in the second direction is equal to the width of the second element region AA2.

In the semiconductor substrate 11 immediately below the second MIS type device A2, a diffusion layer 22A is formed.

A drain diffusion layer 16A of the select gate transistor SGD2 is connected to a drain electrode 19A through a contact plug. A source diffusion layer 17A of the select gate transistor SGS2 is connected to a source electrode 20A through a contact plug.

In the third element region AA3, a third MIS type device A3 functioning as a control device and two select gate transistors SGD3 and SGS3 sandwiching the third MIS type device A3 are arranged. The third MIS type device A3 and the two select gate transistors SGD3 and SGS3 are connected in series with each other.

The structure of the third MIS type device A3 is the same as that of the second MIS type device A2, and the structures of the two select gate transistors SGD3 and SGS3 sandwiching the third MIS type device A3 are the same as those of the select gate transistors SGD2 and SGS2 sandwiching the second MIS type device A2, so that descriptions of the structures will be omitted.

According to the fourth embodiment, when the shape of the floating gate of the first MIS type transistor serving as an aging device is devised, even if the width of the floating gate of the first MIS type transistor in the first direction is not larger than the width in the second direction unlike in the first embodiment, the same effect as that in the first embodiment can be obtained.

(6) Fifth Embodiment

A fifth embodiment is a modification of the fourth embodiment.

The fifth embodiment is different from the fourth embodiment in widths of second and third element regions.

Figure 42:
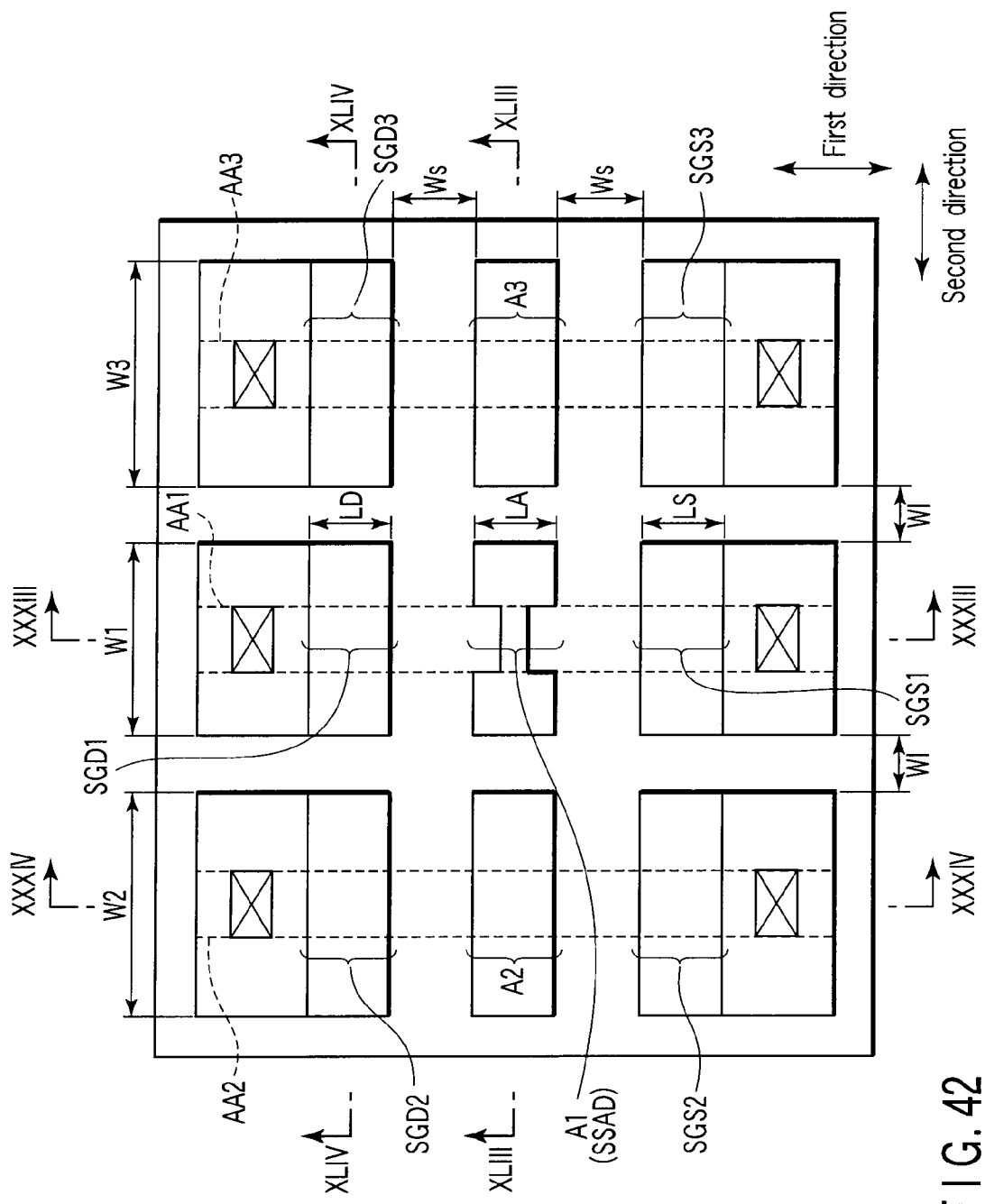
FIG. 42 is a plan view showing a semiconductor integrated circuit according to the fifth embodiment.

FIG. 42 is a plan view of a semiconductor integrated circuit according to the fifth embodiment.

Figure 43:
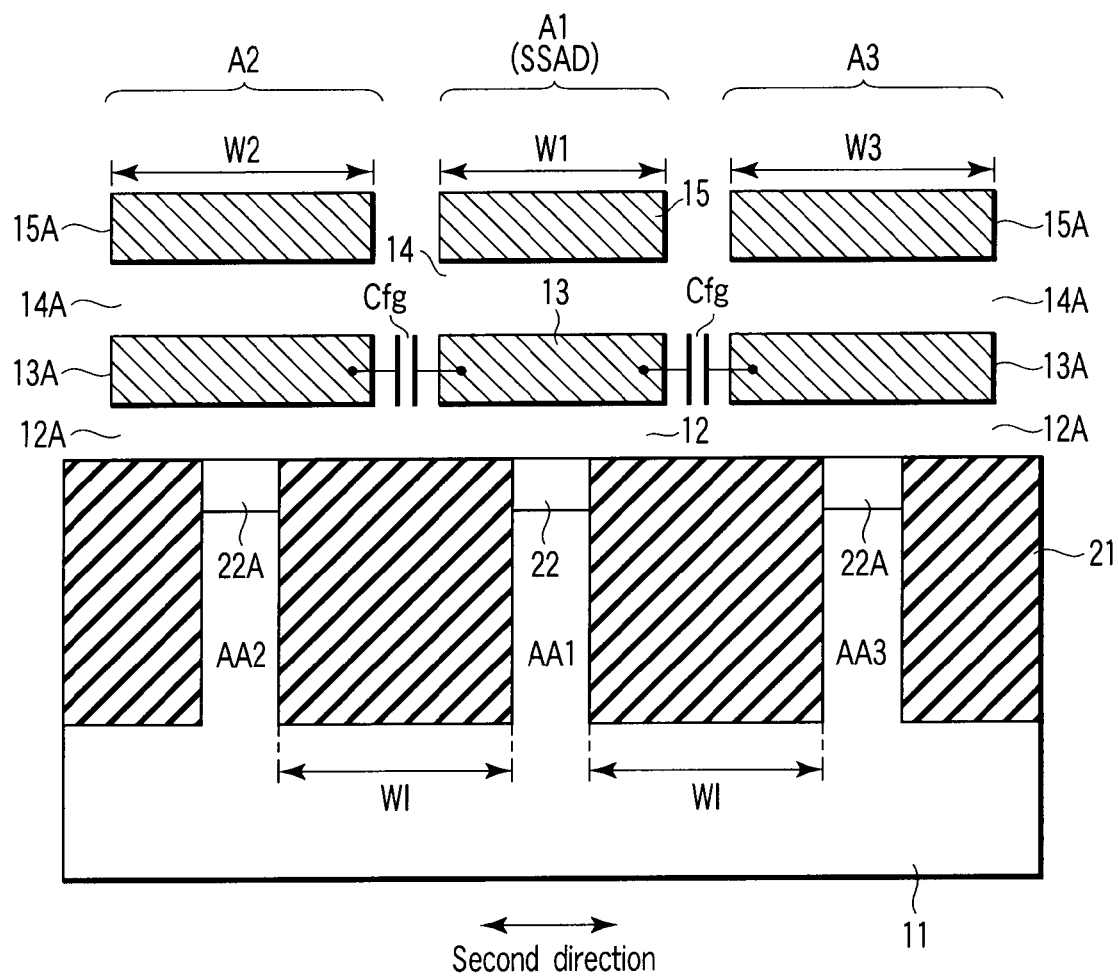
FIG. 43 is a sectional view along the XLIII-XLIII line in FIG. 42.
Figure 44:
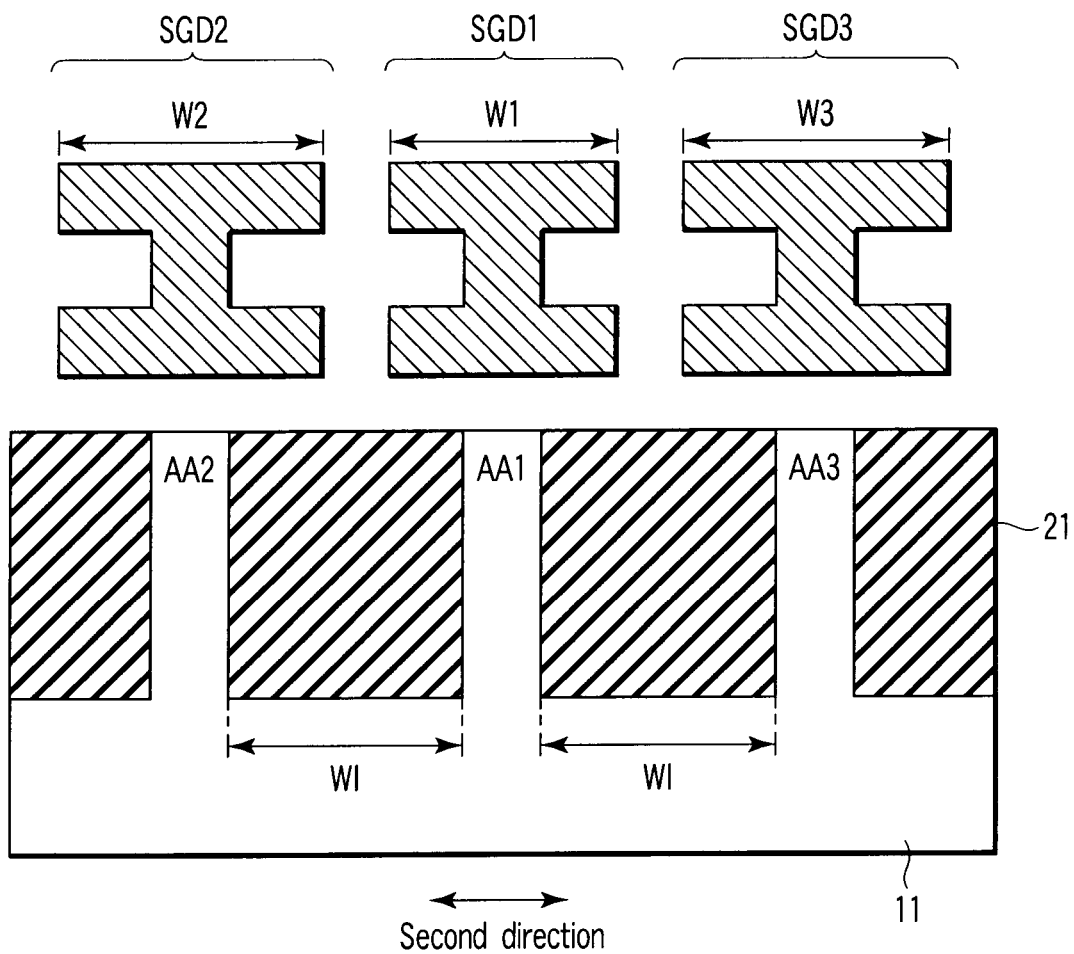
FIG. 44 is a sectional view along the XLIV-XLIV line in FIG. 42.

FIG. 43 is a sectional view along the XLIII-XLIII line in FIG. 42, and FIG. 44 is a sectional view along the XLIV-XLIV line in FIG. 42.

A sectional view along the XXXIII-XXXIII line in FIG. 42 is as shown in FIG. 33, and a sectional view along the XXXIV-XXXIV line in FIG. 42 is as shown in FIG. 34.

In a semiconductor substrate 11, an element isolation insulating layer 21 having an STI structure is formed. First, second, and third element regions (active areas) AA1, AA2, and AA3 are isolated from each other by the element isolation insulating layer 21, and adjacently arranged in a second direction orthogonal to a first direction.

In the first element region AA1, a first MIS type device (SSAD) A1 functioning as an aging device and two select gate transistors SGD1 and SGS1 sandwiching the first MIS type device A1 are arranged. The first MIS type device A1 and the two select gate transistors SGD1 and SGS1 are connected in series with each other.

The first MIS type device A1 has a stack gate structure. More specifically, on the semiconductor substrate 11, a floating gate (FG) 13 is formed through a tunnel insulating film 12, and a control gate electrode (CG) 15 is formed on the floating gate 13 through an inter-electrode insulating layer 14.

The width W1 of the floating gate 13 in the second direction is larger than a width of the first element region AA1. Furthermore, dents are formed on both the sides of the floating gate 13 in the first direction.

In the semiconductor substrate 11 immediately below the first MIS type device A1, a diffusion layer 22 is formed.

A drain diffusion layer 16 of the select gate transistor SGD1 is connected to a drain electrode 19 through a contact plug. A source diffusion layer 17 of the select gate transistor SGS1 is connected to a source electrode 20 through a contact plug.

The widths W1 of the gate electrodes of the select gate transistors SGD1 and SGS1 in the second direction are larger than the width of the first element region AA1.

In the second element region AA2, a second MIS type device A2 functioning as a control device and two select gate transistors SGD2 and SGS2 sandwiching the second MIS type device A2 are arranged. The second MIS type device A2 and the select gate transistors SGD2 and SGS2 are connected in series with each other.

The second MIS type device A2, like the first MIS type device A1, has a stack gate structure. More specifically, on the semiconductor substrate 11, a floating gate (FG) 13A is formed through a tunnel insulating film 12A. On the floating gate 13A, a control gate electrode (CG) 15A is formed through an inter-electrode insulating layer 14A.

A width W2 of the floating gate 13A in the second direction is larger than the width of the second element region AA2.

In the semiconductor substrate 11 immediately below the second MIS type device A2, a diffusion layer 22A is formed.

A drain diffusion layer 16A of the select gate transistor SGD2 is connected to a drain electrode 19A through a contact plug. A source diffusion layer 17A of the select gate transistor SGS2 is connected to a source electrode 20A through a contact plug.

Widths W2 of the gate electrodes of the select gate transistors SGD2 and SGS2 in the second direction are larger than the width of the second element region AA2.

In the third element region AA3, a third MIS type device A3 functioning as a control device and two select gate transistors SGD3 and SGS3 sandwiching the third MIS type device A3 are arranged. The third MIS type device A3 and the two select gate transistors SGD3 and SGS3 are connected in series with each other.

The structure of the third MIS type device A3 is the same as that of the second MIS type device A2, and the structures of the two select gate transistors SGD3 and SGS3 sandwiching the third MIS type device A3 are the same as those of the select gate transistors SGD2 and SGS2 sandwiching the second MIS type device A2, so that descriptions of the structures will be omitted.

According to the fifth embodiment, when the shape of the floating gate of the first MIS type transistor serving as an aging device is devised, even if the width of the floating gate of the first MIS type transistor in the first direction is not larger than the width in the second direction unlike in the first embodiment, the same effect as that in the first embodiment can be obtained.

(7) Others

In the first to fifth embodiments, there are proposed the structures in each of which one aging device is sandwiched by two control devices.

However, the essential of the present invention is that an aging of an aging device is controlled regardless of a thickness of a tunnel insulating film by using a capacitive coupling occurring between a floating gate of a control device and a floating gate of the aging device.

Therefore, the number of control devices is not limited to two. For example, only one control device may be arranged adjacent to an aging device. The number of control devices may be three or more.

In each of the third to fifth embodiments, the shape of a floating gate of the first MIS type transistor A1 serving as an aging device may be variously changed. For example, FIG. 45 shows an example of the shapes.

It is an important point that dents are formed on both the sides of the floating gate of the first MIS type transistor A1 in the first direction to weaken interference between the aging device and the select gate transistor.

3. APPLICATION

An aging device according to the present invention can be applied to various semiconductor integrated circuits. In particular, in terms of processes, the aging device is favorably mounted together with a non-volatile semiconductor memory having a memory cell having a stack gate structure.

For example, as shown in FIG. 46, when reading/writing of data from/in a non-volatile semiconductor memory is performed through an aging device according to the present invention, a period in which reading/writing of data is permitted can be controlled by the aging device.

When such system is constructed, an aging of an entire non-volatile semiconductor memory can be controlled by one aging device. For this reason, in comparison with a case in which agings of bits are independently controlled, agings of bits do not fluctuate. Therefore, the present invention can also contribute to large-capacity non-volatile semiconductor memories the agings of which can be controlled.

4. CONCLUSION

According to the examples of the present invention, an aging of an aging device can be changed by a simple circuit regardless of a thickness of a tunnel insulating film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit, comprising:
   a semiconductor substrate;
   an element isolation insulating layer formed in a surface region of the semiconductor substrate, which isolates first and second element regions in a second direction orthogonal to a first direction; and
   first and second MIS type devices formed respectively in the first and second element regions,
   wherein each of the first and second MIS type devices has a stack gate structure having a floating gate and a control gate electrode, the first MIS type device functions as an aging device, the second MIS type device functions as a control device which controls an electric charge retention characteristic of the aging device by a capacity coupling between the floating gates of the aging device and the control device, and a volume of the floating gate of the control device is made larger than a volume of the floating gate of the aging device.

2. The semiconductor integrated circuit according to claim 1, wherein control gate electrodes of the first and second MIS type devices are independently controlled.

3. The semiconductor integrated circuit according to claim 1, wherein a floating gate of the first MIS type device has the same conductivity type as that of a surface region of the semiconductor substrate immediately below the first MIS type device, and a floating gate of the second MIS type device has a conductivity type opposing a conductivity type of a surface region of the semiconductor substrate immediately below the second MIS type device.

4. The semiconductor integrated circuit according to claim 1, wherein a width of the first element region in the second direction is smaller than a width of the second element region in the second direction.

5. The semiconductor integrated circuit according to claim 1, wherein, in the first MIS type device, a width of the floating gate in the second direction is shorter than a length of the floating gate in the first direction.

6. The semiconductor integrated circuit according to claim 1, wherein, in the first MIS type device, dents are formed on both sides of the floating gate in the first direction.

7. The semiconductor integrated circuit according to claim 1, wherein, in the second MIS type device, a width of the floating gate in the second direction is longer than a length of the floating gate in the first direction.

8. The semiconductor integrated circuit according to claim 1, wherein each of the first and second MIS type devices is sandwiched by two select gate transistors and connected to the two select gate transistors in series with each other.

9. The semiconductor integrated circuit according to claim 8, wherein a width of the element isolation insulating layer between the first and second element regions in the second direction is smaller than a width in the first direction between one gate electrode of the two select gate transistors and the floating gate of the first or second MIS type device.

10. The semiconductor integrated circuit according to claim 8, wherein widths in the second direction of gate electrodes of the two select gate transistors sandwiching the first MIS type device are smaller than a length of the gate electrodes in the first direction.

11. The semiconductor integrated circuit according to claim 1, wherein lengths of the floating gates of the first and second MIS type devices in the first direction are equal to each other.

12. The semiconductor integrated circuit according to claim 8, wherein, of the four select gate transistors sandwiching the first and second MIS type devices, lengths in the first direction of gate electrodes of the two select gate transistors facing each other through the element isolation insulating layer are equal to each other.

13. The semiconductor integrated circuit according to claim 1, further comprising:
   a third element region isolated from the first and second element regions by the element isolation insulating layer and formed adjacent to the first element region; and
   a third MIS type device formed in the third element region, wherein the second and third MIS type devices sandwich the first MIS type device, and the third MIS type device functions as a control device which controls an electric charge retention characteristic of the aging device.

14. The semiconductor integrated circuit according to claim 1, wherein, in the first MIS type device, a width of the floating gate in the second direction is larger than a width of the first element region in the second direction.

15. The semiconductor integrated circuit according to claim 1, wherein, in the second MIS type device, a width of the floating gate in the second direction is larger than a width of the second element region in the second direction.

16. The semiconductor integrated circuit according to claim 1, wherein a width of the element isolation insulating layer in the second direction is larger than a width of the first element region in the second direction and a width of the second element region in the second direction.

17. The semiconductor integrated circuit according to claim 1, wherein a width of a floating gate of the first MIS type device in the second direction is smaller than a width of a floating gate of the second MIS type device in the second direction.

18. A method of initialization of the semiconductor integrated circuit according to claim 13, comprising:
    injecting electric charges into the floating gate of the second or third MIS type device; and
    thereafter, injecting electric charges into the floating gate of the first MIS type device to complete an initial setting.

19. The method according to claim 18, wherein injection of electric charges into the floating gate of the first, second, or third MIS type device is performed by repeatedly applying the same first rectangular pulse or a second rectangular pulse the magnitude or period of which gradually changes to the control gate electrode, and
    immediately after the first or second rectangular pulse is applied, reading which checks a state of the first or second MIS type device is performed, and writing and reading are repeated until the state of the first or second MIS type device becomes a predetermined state.

20. A semiconductor integrated circuit, comprising:
    a semiconductor substrate;
    an element isolation insulating layer formed in a surface region of the semiconductor substrate;
    a diffusion layer of a first conductivity type formed in an element region surrounded by the element isolation insulating layer;
    first and second MIS type devices aligned in a first direction on the diffusion layer; and
    two select gate transistors arranged at two end portions of the diffusion layer in the first direction, respectively,
    wherein each of the first and second MIS type devices has a stack gate structure having a floating gate and a control gate electrode, the first MIS type device functions as an aging device, the second MIS type device functions as a control device which controls an electric charge retention characteristic of the aging device by a capacity coupling between the floating gates of the aging device and the control device, and a volume of the floating gate of the control device is made larger than a volume of the floating gate of the aging device.

21. The semiconductor integrated circuit according to claim 20, wherein control gate electrodes of the first and second MIS type devices are independently controlled.

22. The semiconductor integrated circuit according to claim 20, wherein a floating gate of the first MIS type device is of the first conductivity type, and a floating gate of the second MIS type device is of a second conductivity type different from the first conductivity type.

23. A method of initialization of the semiconductor integrated circuit according to claim 20, comprising:
    injecting electric charges into the floating gate of the second MIS type device; and
    thereafter, injecting electric charges into the floating gate of the first MIS type device to complete an initial setting.

24. The method according to claim 23, wherein after electric charges are injected into the floating gate of the first MIS type device, writing back which extracts electric charges in the floating gate of the second MIS type device is performed.

* * * * *